United States Patent
Watanabe et al.

(10) Patent No.: US 10,079,342 B2
(45) Date of Patent: Sep. 18, 2018

(54) FUNCTIONAL LAYER FORMING COMPOSITION, METHOD FOR PRODUCING FUNCTIONAL LAYER FORMING COMPOSITION, METHOD FOR PRODUCING ORGANIC EL ELEMENT, ORGANIC EL DEVICE, AND ELECTRONIC APPARATUS

(71) Applicant: SEIKO EPSON CORPORATION, Tokyo (JP)

(72) Inventors: Shotaro Watanabe, Suwa (JP); Keisuke Morita, Matsumoto (JP); Takuya Sonoyama, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/556,583

(22) PCT Filed: Feb. 25, 2016

(86) PCT No.: PCT/JP2016/001031
§ 371 (c)(1),
(2) Date: Sep. 7, 2017

(87) PCT Pub. No.: WO2016/152028
PCT Pub. Date: Sep. 29, 2016

(65) Prior Publication Data
US 2018/0062078 A1 Mar. 1, 2018

(30) Foreign Application Priority Data
Mar. 25, 2015 (JP) .................. 2015-062200

(51) Int. Cl.
*H01L 51/00* (2006.01)
*H01L 51/50* (2006.01)
(Continued)

(52) U.S. Cl.
CPC .......... *H01L 51/0005* (2013.01); *C09D 11/36* (2013.01); *C09D 11/52* (2013.01);
(Continued)

(58) Field of Classification Search
None
See application file for complete search history.

(56) References Cited

U.S. PATENT DOCUMENTS 6,582,504 B1   6/2003 Fujita
2004/0054174 A1   3/2004 Nakaya et al.
(Continued)

FOREIGN PATENT DOCUMENTS

JP   2001-155861 A   6/2001
JP   2001-279134 A   10/2001
(Continued)

OTHER PUBLICATIONS

May 24, 2016 Search Report issued in International Patent Application No. PCT/JP2016/001031.

*Primary Examiner* — Asok K Sarkar
(74) *Attorney, Agent, or Firm* — Oliff PLC

(57) ABSTRACT

A functional layer forming composition is capable of obtaining a stable film forming property when a liquid phase process is used. A method produces a functional layer forming composition. A method produces an organic EL element. An organic EL device and an electronic apparatus are also described. A functional layer forming composition is used when at least one layer in a functional layer containing an organic material is formed by a liquid phase process, and is characterized in that the composition includes a solid component for forming a functional layer, a first aromatic solvent having an electron withdrawing group, and a second aromatic solvent having an electron donating (Continued)

group, and the boiling point of the second aromatic solvent is higher than the boiling point of the first aromatic solvent.

12 Claims, 18 Drawing Sheets

(51) Int. Cl.
  *C09D 11/36* (2014.01)
  *H01L 51/56* (2006.01)
  *C09D 11/52* (2014.01)
  *H01L 27/32* (2006.01)
  *H01L 51/52* (2006.01)

(52) U.S. Cl.
  CPC ........ *H01L 51/005* (2013.01); *H01L 51/0007* (2013.01); *H01L 51/0059* (2013.01); *H01L 51/56* (2013.01); *H01L 27/3211* (2013.01); *H01L 51/5012* (2013.01); *H01L 51/5056* (2013.01); *H01L 51/5088* (2013.01); *H01L 51/5271* (2013.01)

(56) References Cited

U.S. PATENT DOCUMENTS

| | | | |
|---|---|---|---|
| 2008/0048181 A1* | 2/2008 | Tanaka | C07D 333/18 257/40 |
| 2011/0057151 A1 | 3/2011 | Chen et al. | |
| 2012/0025177 A1 | 2/2012 | Yoon et al. | |
| 2012/0049120 A1 | 3/2012 | Chen et al. | |

FOREIGN PATENT DOCUMENTS

| | | |
|---|---|---|
| JP | 2009-059846 A | 3/2009 |
| JP | 2010-209317 A | 9/2010 |
| JP | 2011-129744 A | 6/2011 |
| JP | 2012-153742 A | 8/2012 |
| JP | 2012-517422 A | 8/2012 |
| JP | 2013-504663 A | 2/2013 |
| KR | 10-2014-0087250 A | 7/2014 |
| WO | 02/12208 A1 | 2/2002 |
| WO | 2011/032010 A1 | 3/2011 |

* cited by examiner

FIG. 5A

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| HIL, HTL | PVK<br>PF<br>PPV<br>PMPS<br>PTTA<br>Poly [N,N'-bis(4-butylphenyl)-N,N'-bis(phenyl)-benzidine]<br>TFB | NITROBENZENE | 2-METHOXYTOLUENE | -40 | D | D | D | D | D | D | D |
| | | 2,3-DIMETHYLNITROBENZENE | | -75 | D | D | C | C | C | C | C |
| | | 2,4-DIMETHYLNITROBENZENE | | -75 | D | D | C | C | C | C | C |

FIG. 5B

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| HIL, HTL | PVK<br>PF<br>PPV<br>PMPS<br>PTTA<br>Poly [N,N'-bis(4-butylphenyl)-N,N'-bis(phenyl)-benzidine]<br>TFB | NITROBENZENE | α,α,4-TRIMETHOXYTOLUENE | 43 | A | D | C | C | C | D | D |
| | | 2,3-DIMETHYLNITROBENZENE | | 8 | A | A | A | A | A | A | C |
| | | 2,4-DIMETHYLNITROBENZENE | | 8 | A | A | A | A | A | A | C |

FIG. 5C

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| HIL, HTL | PVK<br>PF<br>PPV<br>PMPS<br>PTTA<br>Poly [N,N'-bis(4-butylphenyl)-N,N'-bis(phenyl)-benzidine]<br>TFB | NITROBENZENE | DIPHENYL ETHER | 48 | A | D | C | A | A | D | D |
| | | 2,3-DIMETHYLNITROBENZENE | | 13 | A | A | A | A | A | A | C |
| | | 2,4-DIMETHYLNITROBENZENE | | 13 | A | A | A | A | A | A | C |

FIG. 5D

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| HIL, HTL | PVK<br>PF<br>PPV<br>PMPS<br>PTTA<br>Poly [N,N'-bis(4-butylphenyl)-N,N'-bis(phenyl)-benzidine]<br>TFB | NITROBENZENE | 3-PHENOXYTOLUENE | 62 | A | D | C | A | A | D | D |
| | | 2,3-DIMETHYLNITROBENZENE | | 27 | A | A | A | A | A | A | C |
| | | 2,4-DIMETHYLNITROBENZENE | | 27 | A | A | A | A | A | A | C |

FIG. 6E

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| HIL, HTL | PVK PF PPV PMPS PTTA Poly [N,N'-bis (4-butylphenyl)-N,N'-bis(phenyl)-benzidine] TFB | NITROBENZENE | BENZYLPHENYL ETHER | 78 | A | A | A | A | A | A | D |
| | | 2,3-DIMETHYLNITROBENZENE | | 43 | A | A | A | A | A | A | C |
| | | 2,4-DIMETHYLNITROBENZENE | | 43 | A | A | A | A | A | A | C |

FIG. 6F

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| HIL, HTL | PVK PF PPV PMPS PTTA Poly [N,N'-bis (4-butylphenyl)-N,N'-bis(phenyl)-benzidine] TFB | NITROBENZENE | AMINOBIPHENYL | 89 | A | A | A | A | A | A | D |
| | | 2,3-DIMETHYLNITROBENZENE | | 54 | A | A | A | A | A | A | C |
| | | 2,4-DIMETHYLNITROBENZENE | | 54 | A | A | A | A | A | A | C |

FIG. 6G

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| HIL, HTL | PVK PF PPV PMPS PTTA Poly [N,N'-bis (4-butylphenyl)-N,N'-bis(phenyl)-benzidine] TFB | NITROBENZENE | DIPHENYLAMINE | 92 | A | A | A | A | A | A | D |
| | | 2,3-DIMETHYLNITROBENZENE | | 57 | A | A | A | A | A | A | C |
| | | 2,4-DIMETHYLNITROBENZENE | | 57 | A | A | A | A | A | A | C |

FIG. 7A

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | | |
|---|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| EML | Red-Poly-EM | NITROBENZENE | 2-METHOXYTOLUENE | -40 | D | D | D | D | D | D | D |
| | Green-Poly-EM | 2,3-DIMETHYLNITROBENZENE | | -75 | D | D | D | C | C | C | C |
| | Blue-Poly-EM | 2,4-DIMETHYLNITROBENZENE | | -75 | D | D | D | C | C | C | C |

FIG. 7B

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | | |
|---|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| EML | Red-Poly-EM | NITROBENZENE | α,α,4-TRIMETHOXYTOLUENE | 43 | A | A | A | A | A | A | D |
| | Green-Poly-EM | 2,3-DIMETHYLNITROBENZENE | | 8 | A | A | A | A | A | A | C |
| | Blue-Poly-EM | 2,4-DIMETHYLNITROBENZENE | | 8 | A | A | A | A | A | A | C |

FIG. 7C

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | | |
|---|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| EML | Red-Poly-EM | NITROBENZENE | DIPHENYL ETHER | 48 | A | A | A | A | A | A | D |
| | Green-Poly-EM | 2,3-DIMETHYLNITROBENZENE | | 13 | A | A | A | A | A | A | C |
| | Blue-Poly-EM | 2,4-DIMETHYLNITROBENZENE | | 13 | A | A | A | A | A | A | C |

FIG. 7D

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | | |
|---|---|---|---|---|---|---|---|---|---|---|---|---|
| | | FIRST AROMATIC SOLVENT A | SECOND AROMATIC SOLVENT B | | 0:100 | 10:90 | 30:70 | 50:50 | 70:30 | 90:10 | 100:0 |
| EML | Red-Poly-EM | NITROBENZENE | 3-PHENOXYTOLUENE | 62 | A | A | A | A | A | A | D |
| | Green-Poly-EM | 2,3-DIMETHYLNITROBENZENE | | 27 | A | A | A | A | A | A | C |
| | Blue-Poly-EM | 2,4-DIMETHYLNITROBENZENE | | 27 | A | A | A | A | A | A | C |

FIG. 8E

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| EML | Red-Poly-EM Green-Poly-EM Blue-Poly-EM | NITROBENZENE | BENZYLPHENYL ETHER | 78 | A | A | A | A | A | A | D |
| | | 2,3-DIMETHYLNITROBENZENE | | 43 | A | A | A | A | A | A | C |
| | | 2,4-DIMETHYLNITROBENZENE | | 43 | A | A | A | A | A | A | C |

FIG. 8F

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| EML | Red-Poly-EM Green-Poly-EM Blue-Poly-EM | NITROBENZENE | AMINOBIPHENYL | 89 | A | A | A | A | A | A | D |
| | | 2,3-DIMETHYLNITROBENZENE | | 54 | A | A | A | A | A | A | C |
| | | 2,4-DIMETHYLNITROBENZENE | | 54 | A | A | A | A | A | A | C |

FIG. 8G

| FUNCTIONAL LAYER | MATERIAL | SOLVENT CONFIGURATION | | DIFFERENCE IN BOILING POINT (B - A) | INK EJECTION PROPERTY / CONTENT RATIO (A : B) IN MIXED SOLVENT | | | | | | |
|---|---|---|---|---|---|---|---|---|---|---|---|
| | | FIRST AROMATIC SOLVENT A | SECOND AROMATIC SOLVENT B | | 0 : 100 | 10 : 90 | 30 : 70 | 50 : 50 | 70 : 30 | 90 : 10 | 100 : 0 |
| EML | Red-Poly-EM Green-Poly-EM Blue-Poly-EM | NITROBENZENE | DIPHENYLAMINE | 92 | A | A | A | A | A | A | D |
| | | 2,3-DIMETHYLNITROBENZENE | | 57 | A | A | A | A | A | A | C |
| | | 2,4-DIMETHYLNITROBENZENE | | 57 | A | A | A | A | A | A | C |

FIG. 9A

| Functional Layer | Material | Solvent Configuration | | Film Flatness / Content Ratio (A : B) in Mixed Solvent | | | | | | | |
|---|---|---|---|---|---|---|---|---|---|---|---|
| | | First Aromatic Solvent A | Second Aromatic Solvent B | Difference in Boiling Point (B - A) | 0:100 | 10:90 | 30:70 | 50:50 | 70:30 | 90:10 | 100:0 |
| HIL, HTL | PVK, PF, PPV, PMPS, PTTA, Poly [N,N'-bis(4-butylphenyl)-N,N'-bis(phenyl)-benzidine], TFB | Nitrobenzene | 2-Methoxytoluene | -40 | E | D | D | D | D | D | D |
| | | 2,3-Dimethylnitrobenzene | | -75 | E | C | C | C | C | C | C |
| | | 2,4-Dimethylnitrobenzene | | -75 | E | C | C | C | C | C | C |

FIG. 9B

| Functional Layer | Material | Solvent Configuration | | Film Flatness / Content Ratio (A : B) in Mixed Solvent | | | | | | | |
|---|---|---|---|---|---|---|---|---|---|---|---|
| | | First Aromatic Solvent A | Second Aromatic Solvent B | Difference in Boiling Point (B - A) | 0:100 | 10:90 | 30:70 | 50:50 | 70:30 | 90:10 | 100:0 |
| HIL, HTL | PVK, PF, PPV, PMPS, PTTA, Poly [N,N'-bis(4-butylphenyl)-N,N'-bis(phenyl)-benzidine], TFB | Nitrobenzene | α,α,4-Trimethoxytoluene | 43 | B | A | A | A | A | A | D |
| | | 2,3-Dimethylnitrobenzene | | 8 | B | A | A | A | A | A | C |
| | | 2,4-Dimethylnitrobenzene | | 8 | B | A | A | A | A | A | C |

FIG. 9C

| Functional Layer | Material | Solvent Configuration | | Film Flatness / Content Ratio (A : B) in Mixed Solvent | | | | | | | |
|---|---|---|---|---|---|---|---|---|---|---|---|
| | | First Aromatic Solvent A | Second Aromatic Solvent B | Difference in Boiling Point (B - A) | 0:100 | 10:90 | 30:70 | 50:50 | 70:30 | 90:10 | 100:0 |
| HIL, HTL | PVK, PF, PPV, PMPS, PTTA, Poly [N,N'-bis(4-butylphenyl)-N,N'-bis(phenyl)-benzidine], TFB | Nitrobenzene | Diphenyl Ether | 48 | B | A | A | A | A | A | D |
| | | 2,3-Dimethylnitrobenzene | | 13 | B | A | A | A | A | A | C |
| | | 2,4-Dimethylnitrobenzene | | 13 | B | A | A | A | A | A | C |

FIG. 9D

| Functional Layer | Material | Solvent Configuration | | Film Flatness / Content Ratio (A : B) in Mixed Solvent | | | | | | | |
|---|---|---|---|---|---|---|---|---|---|---|---|
| | | First Aromatic Solvent A | Second Aromatic Solvent B | Difference in Boiling Point (B - A) | 0:100 | 10:90 | 30:70 | 50:50 | 70:30 | 90:10 | 100:0 |
| HIL, HTL | PVK, PF, PPV, PMPS, PTTA, Poly [N,N'-bis(4-butylphenyl)-N,N'-bis(phenyl)-benzidine], TFB | Nitrobenzene | 3-Phenoxytoluene | 62 | B | A | A | A | A | A | D |
| | | 2,3-Dimethylnitrobenzene | | 27 | B | A | A | A | A | A | C |
| | | 2,4-Dimethylnitrobenzene | | 27 | B | A | A | A | A | A | C |

FIG. 10E

| Functional Layer | Material | Solvent Configuration | | Difference in Boiling Point (B − A) | Film Flatness / Content Ratio (A : B) in Mixed Solvent | | | | | | |
|---|---|---|---|---|---|---|---|---|---|---|---|
| | | First Aromatic Solvent A | Second Aromatic Solvent B | | 0 : 100 | 10 : 90 | 30 : 70 | 50 : 50 | 70 : 30 | 90 : 10 | 100 : 0 |
| HIL, HTL | PVK<br>PF<br>PPV<br>PMPS<br>PTTA<br>Poly[N,N'-bis(4-butylphenyl)-N,N'-bis(phenyl)-benzidine]<br>TFB | Nitrobenzene | Benzylphenyl Ether | 78 | B | A | A | A | A | A | D |
| | | 2,3-Dimethylnitrobenzene | | 43 | B | A | A | A | A | A | C |
| | | 2,4-Dimethylnitrobenzene | | 43 | B | A | A | A | A | A | C |

FIG. 10F

| Functional Layer | Material | Solvent Configuration | | Difference in Boiling Point (B − A) | Film Flatness / Content Ratio (A : B) in Mixed Solvent | | | | | | |
|---|---|---|---|---|---|---|---|---|---|---|---|
| | | First Aromatic Solvent A | Second Aromatic Solvent B | | 0 : 100 | 10 : 90 | 30 : 70 | 50 : 50 | 70 : 30 | 90 : 10 | 100 : 0 |
| HIL, HTL | PVK<br>PF<br>PPV<br>PMPS<br>PTTA<br>Poly[N,N'-bis(4-butylphenyl)-N,N'-bis(phenyl)-benzidine]<br>TFB | Nitrobenzene | Aminobiphenyl | 89 | B | A | A | A | A | A | D |
| | | 2,3-Dimethylnitrobenzene | | 54 | B | A | A | A | A | A | C |
| | | 2,4-Dimethylnitrobenzene | | 54 | B | A | A | A | A | A | C |

FIG. 10G

| Functional Layer | Material | Solvent Configuration | | Difference in Boiling Point (B − A) | Film Flatness / Content Ratio (A : B) in Mixed Solvent | | | | | | |
|---|---|---|---|---|---|---|---|---|---|---|---|
| | | First Aromatic Solvent A | Second Aromatic Solvent B | | 0 : 100 | 10 : 90 | 30 : 70 | 50 : 50 | 70 : 30 | 90 : 10 | 100 : 0 |
| HIL, HTL | PVK<br>PF<br>PPV<br>PMPS<br>PTTA<br>Poly[N,N'-bis(4-butylphenyl)-N,N'-bis(phenyl)-benzidine]<br>TFB | Nitrobenzene | Diphenylamine | 92 | B | A | A | A | A | A | D |
| | | 2,3-Dimethylnitrobenzene | | 57 | B | A | A | A | A | A | C |
| | | 2,4-Dimethylnitrobenzene | | 57 | B | A | A | A | A | A | C |

FIG.11A

| FUNCTIONAL LAYER | MATERIAL | SOLVENT CONFIGURATION | | FILM FLATNESS / CONTENT RATIO (A:B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0:100 | 10:90 | 30:70 | 50:50 | 70:30 | 90:10 | 100:0 | |
| EML | Red-Poly-EM | NITROBENZENE | 2-METHOXYTOLUENE | -40 | E | D | D | D | D | D | D | |
| | Green-Poly-EM | 2,3-DIMETHYLNITROBENZENE | | -75 | E | C | C | C | C | C | C | |
| | Blue-Poly-EM | 2,4-DIMETHYLNITROBENZENE | | -75 | E | C | C | C | C | C | C | |

FIG.11B

| FUNCTIONAL LAYER | MATERIAL | SOLVENT CONFIGURATION | | FILM FLATNESS / CONTENT RATIO (A:B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0:100 | 10:90 | 30:70 | 50:50 | 70:30 | 90:10 | 100:0 | |
| EML | Red-Poly-EM | NITROBENZENE | α,α,4-TRIMETHOXYTOLUENE | 43 | B | A | A | A | A | A | D | |
| | Green-Poly-EM | 2,3-DIMETHYLNITROBENZENE | | 8 | B | A | A | A | A | A | C | |
| | Blue-Poly-EM | 2,4-DIMETHYLNITROBENZENE | | 8 | B | A | A | A | A | A | C | |

FIG.11C

| FUNCTIONAL LAYER | MATERIAL | SOLVENT CONFIGURATION | | FILM FLATNESS / CONTENT RATIO (A:B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0:100 | 10:90 | 30:70 | 50:50 | 70:30 | 90:10 | 100:0 | |
| EML | Red-Poly-EM | NITROBENZENE | DIPHENYL ETHER | 48 | B | A | A | A | A | A | D | |
| | Green-Poly-EM | 2,3-DIMETHYLNITROBENZENE | | 13 | B | A | A | A | A | A | C | |
| | Blue-Poly-EM | 2,4-DIMETHYLNITROBENZENE | | 13 | B | A | A | A | A | A | C | |

FIG.11D

| FUNCTIONAL LAYER | MATERIAL | SOLVENT CONFIGURATION | | FILM FLATNESS / CONTENT RATIO (A:B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0:100 | 10:90 | 30:70 | 50:50 | 70:30 | 90:10 | 100:0 | |
| EML | Red-Poly-EM | NITROBENZENE | 3-PHENOXYTOLUENE | 62 | B | A | A | A | A | A | D | |
| | Green-Poly-EM | 2,3-DIMETHYLNITROBENZENE | | 27 | B | A | A | A | A | A | C | |
| | Blue-Poly-EM | 2,4-DIMETHYLNITROBENZENE | | 27 | B | A | A | A | A | A | C | |

FIG. 12E

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | Red-Poly-EM | NITROBENZENE | BENZYLPHENYL ETHER | 78 | B | A | A | A | A | A | D |
| | Green-Poly-EM | 2,3-DIMETHYLNITROBENZENE | | 43 | B | A | A | A | A | A | C |
| | Blue-Poly-EM | 2,4-DIMETHYLNITROBENZENE | | 43 | B | A | A | A | A | A | C |

FIG. 12F

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | Red-Poly-EM | NITROBENZENE | AMINOBIPHENYL | 89 | B | A | A | A | A | A | D |
| | Green-Poly-EM | 2,3-DIMETHYLNITROBENZENE | | 54 | B | A | A | A | A | A | C |
| | Blue-Poly-EM | 2,4-DIMETHYLNITROBENZENE | | 54 | B | A | A | A | A | A | C |

FIG. 12G

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | Red-Poly-EM | NITROBENZENE | DIPHENYLAMINE | 92 | B | A | A | A | A | A | D |
| | Green-Poly-EM | 2,3-DIMETHYLNITROBENZENE | | 57 | B | A | A | A | A | A | C |
| | Blue-Poly-EM | 2,4-DIMETHYLNITROBENZENE | | 57 | B | A | A | A | A | A | C |

FIG.13A

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA CuPc, TAPC, TPD, α-NPD, m-MTDATA PDA-Si 2-TNATA, TCTA, TDAPB SPIRO-TAD, DPPD HTM1, HTM2, TPT1, TPTE | NITROBENZENE | 2-METHOXYTOLUENE | -40 | E | D | D | D | D | D | D |
| | | 2,3-DIMETHYLNITROBENZENE | | -75 | E | C | C | C | C | C | C |
| | | 2,4-DIMETHYLNITROBENZENE | | -75 | E | C | C | C | C | C | C |

FIG.13B

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA CuPc, TAPC, TPD, α-NPD, m-MTDATA PDA-Si 2-TNATA, TCTA, TDAPB SPIRO-TAD, DPPD HTM1, HTM2, TPT1, TPTE | NITROBENZENE | α,α,4-TRIMETHOXYTOLUENE | 43 | B | A | A | A | A | A | D |
| | | 2,3-DIMETHYLNITROBENZENE | | 8 | B | A | A | A | A | A | C |
| | | 2,4-DIMETHYLNITROBENZENE | | 8 | B | A | A | A | A | A | C |

FIG.13C

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA CuPc, TAPC, TPD, α-NPD, m-MTDATA PDA-Si 2-TNATA, TCTA, TDAPB SPIRO-TAD, DPPD HTM1, HTM2, TPT1, TPTE | NITROBENZENE | DIPHENYL ETHER | 48 | B | A | A | A | A | A | D |
| | | 2,3-DIMETHYLNITROBENZENE | | 13 | B | A | A | A | A | A | C |
| | | 2,4-DIMETHYLNITROBENZENE | | 13 | B | A | A | A | A | A | C |

FIG.13D

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA CuPc, TAPC, TPD, α-NPD, m-MTDATA PDA-Si 2-TNATA, TCTA, TDAPB SPIRO-TAD, DPPD HTM1, HTM2, TPT1, TPTE | NITROBENZENE | 3-PHENOXYTOLUENE | 62 | B | A | A | A | A | A | D |
| | | 2,3-DIMETHYLNITROBENZENE | | 27 | B | A | A | A | A | A | C |
| | | 2,4-DIMETHYLNITROBENZENE | | 27 | B | A | A | A | A | A | C |

FIG. 14E

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA, CuPc, TAPC, TPD, α-NPD, m-MTDATA, PDA-Si, 2-TNATA, TCTA, TDAPB, SPIRO-TAD, DPPD, HTM1, HTM2, TPT1, TPTE | NITROBENZENE | BENZYLPHENYL ETHER | 78 | B | A | A | A | A | A | D |
| | | 2,3-DIMETHYLNITROBENZENE | | 43 | B | A | A | A | A | A | C |
| | | 2,4-DIMETHYLNITROBENZENE | | 43 | B | A | A | A | A | A | C |

FIG. 14F

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA, CuPc, TAPC, TPD, α-NPD, m-MTDATA, PDA-Si, 2-TNATA, TCTA, TDAPB, SPIRO-TAD, DPPD, HTM1, HTM2, TPT1, TPTE | NITROBENZENE | AMINOBIPHENYL | 89 | B | A | A | A | A | A | D |
| | | 2,3-DIMETHYLNITROBENZENE | | 54 | B | A | A | A | A | A | C |
| | | 2,4-DIMETHYLNITROBENZENE | | 54 | B | A | A | A | A | A | C |

FIG. 14G

| FUNCTIONAL LAYER | MATERIAL | SOLVENT CONFIGURATION | | FILM FLATNESS / CONTENT RATIO (A : B) IN MIXED SOLVENT | | | | | | | | |
|---|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| HIL, HTL | VB-TCA, CuPc, TAPC, TPD, α-NPD, m-MTDATA, PDA-Si, 2-TNATA, TCTA, TDAPB, SPIRO-TAD, DPPD, HTM1, HTM2, TPT1, TPTE | NITROBENZENE | DIPHENYLAMINE | 92 | B | A | A | A | A | A | D |
| | | 2,3-DIMETHYLNITROBENZENE | | 57 | B | A | A | A | A | A | C |
| | | 2,4-DIMETHYLNITROBENZENE | | 57 | B | A | A | A | A | A | C |

FIG. 15A

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST> CBP, BAlq, mCP, CDBP, DCB P06, SimCP, UGH3, TDAPB <RED DOPANT> Bt2Ir(acac), Btp2Ir(acac) PtOEP <GREEN DOPANT> Ir(ppy)3, Ppy2Ir(acac) <BLUE DOPANT> FIrpic, Ir(pmb)3, FIrN4 | NITROBENZENE | 2-METHOXYTOLUENE | -40 | E | D | D | D | D | D | D |
| | | 2,3-DIMETHYLNITROBENZENE | | -75 | E | C | C | C | C | C | C |
| | | 2,4-DIMETHYLNITROBENZENE | | -75 | E | C | C | C | C | C | C |

FIG. 15B

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST> CBP, BAlq, mCP, CDBP, DCB P06, SimCP, UGH3, TDAPB <RED DOPANT> Bt2Ir(acac), Btp2Ir(acac) PtOEP <GREEN DOPANT> Ir(ppy)3, Ppy2Ir(acac) <BLUE DOPANT> FIrpic, Ir(pmb)3, FIrN4 | NITROBENZENE | α,α,4-TRIMETHOXYTOLUENE | 43 | B | A | A | A | A | A | D |
| | | 2,3-DIMETHYLNITROBENZENE | | 8 | B | A | A | A | A | A | C |
| | | 2,4-DIMETHYLNITROBENZENE | | 8 | B | A | A | A | A | A | C |

FIG. 15C

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST> CBP, BAlq, mCP, CDBP, DCB P06, SimCP, UGH3, TDAPB <RED DOPANT> Bt2Ir(acac), Btp2Ir(acac) PtOEP <GREEN DOPANT> Ir(ppy)3, Ppy2Ir(acac) <BLUE DOPANT> FIrpic, Ir(pmb)3, FIrN4 | NITROBENZENE | DIPHENYL ETHER | 48 | B | A | A | A | A | A | D |
| | | 2,3-DIMETHYLNITROBENZENE | | 13 | B | A | A | A | A | A | C |
| | | 2,4-DIMETHYLNITROBENZENE | | 13 | B | A | A | A | A | A | C |

FIG. 15D

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST> CBP, BAlq, mCP, CDBP, DCB P06, SimCP, UGH3, TDAPB <RED DOPANT> Bt2Ir(acac), Btp2Ir(acac) PtOEP <GREEN DOPANT> Ir(ppy)3, Ppy2Ir(acac) <BLUE DOPANT> FIrpic, Ir(pmb)3, FIrN4 | NITROBENZENE | 3-PHENOXYTOLUENE | 62 | B | A | A | A | A | A | D |
| | | 2,3-DIMETHYLNITROBENZENE | | 27 | B | A | A | A | A | A | C |
| | | 2,4-DIMETHYLNITROBENZENE | | 27 | B | A | A | A | A | A | C |

FIG. 16E

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST><br>CBP, BAlq, mCP,<br>CDBP, DCB<br>P06, SimCP, UGH3, TDAPB<br><RED DOPANT><br>Bt2Ir(acac), Btp2Ir(acac)<br>PtOEP<br><GREEN DOPANT><br>Ir(ppy)3, Ppy2Ir(acac)<br><BLUE DOPANT><br>FIrpic, Ir(pmb)3, FIrN4 | NITROBENZENE | BENZYLPHENYL ETHER | 78 | B | A | A | A | A | A | D |
| | | 2,3-DIMETHYLNITROBENZENE | | 43 | B | A | A | A | A | A | C |
| | | 2,4-DIMETHYLNITROBENZENE | | 43 | B | A | A | A | A | A | C |

FIG. 16F

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST><br>CBP, BAlq, mCP,<br>CDBP, DCB<br>P06, SimCP, UGH3, TDAPB<br><RED DOPANT><br>Bt2Ir(acac), Btp2Ir(acac)<br>PtOEP<br><GREEN DOPANT><br>Ir(ppy)3, Ppy2Ir(acac)<br><BLUE DOPANT><br>FIrpic, Ir(pmb)3, FIrN4 | NITROBENZENE | AMINOBIPHENYL | 89 | B | A | A | A | A | A | D |
| | | 2,3-DIMETHYLNITROBENZENE | | 54 | B | A | A | A | A | A | C |
| | | 2,4-DIMETHYLNITROBENZENE | | 54 | B | A | A | A | A | A | C |

FIG. 16G

| FUNCTIONAL LAYER | MATERIAL | SOLVENT CONFIGURATION | | FILM FLATNESS / CONTENT RATIO (A : B) IN MIXED SOLVENT | | | | | | | |
|---|---|---|---|---|---|---|---|---|---|---|---|
| | | FIRST AROMATIC SOLVENT A | SECOND AROMATIC SOLVENT B | DIFFERENCE IN BOILING POINT (B - A) | 0 : 100 | 10 : 90 | 30 : 70 | 50 : 50 | 70 : 30 | 90 : 10 | 100 : 0 |
| EML | <HOST><br>CBP, BAlq, mCP,<br>CDBP, DCB<br>P06, SimCP, UGH3, TDAPB<br><RED DOPANT><br>Bt2Ir(acac), Btp2Ir(acac)<br>PtOEP<br><GREEN DOPANT><br>Ir(ppy)3, Ppy2Ir(acac)<br><BLUE DOPANT><br>FIrpic, Ir(pmb)3, FIrN4 | NITROBENZENE | DIPHENYLAMINE | 92 | B | A | A | A | A | A | D |
| | | 2,3-DIMETHYLNITROBENZENE | | 57 | B | A | A | A | A | A | C |
| | | 2,4-DIMETHYLNITROBENZENE | | 57 | B | A | A | A | A | A | C |

| | LIGHT EMITTING LAYER : F8BT | | |
|---|---|---|---|
| | 1000 cd/m² | | |
| | DRIVING VOLTAGE | CURRENT EFFICIENCY | HALF LIFETIME |
| COMPARATIVE EXAMPLE 1 | 1 | 1 | 1 |
| COMPARATIVE EXAMPLE 2 | B | B | B |
| COMPARATIVE EXAMPLE 3 | B | B | B |
| EXAMPLE 1 | S | S | S |
| EXAMPLE 2 | S | S | S |
| EXAMPLE 3 | S | S | S |
| EXAMPLE 4 | S | S | A |
| EXAMPLE 5 | A | A | A |
| EXAMPLE 6 | S | S | S |
| EXAMPLE 7 | S | S | S |
| EXAMPLE 8 | S | S | S |
| EXAMPLE 9 | S | S | A |
| EXAMPLE 10 | A | A | A |
| EXAMPLE 11 | S | S | S |
| EXAMPLE 12 | S | S | S |
| EXAMPLE 13 | S | S | S |
| EXAMPLE 14 | S | S | A |
| EXAMPLE 15 | A | A | A |

FIG.17

| | LIGHT EMITTING LAYER : TDAPB HOST and Ppy2Ir (acac) | | |
|---|---|---|---|
| | 1000 cd/m$^2$ | | |
| | DRIVING VOLTAGE | CURRENT EFFICIENCY | HALF LIFETIME |
| COMPARATIVE EXAMPLE 4 | 1 | 1 | 1 |
| COMPARATIVE EXAMPLE 5 | B | B | B |
| COMPARATIVE EXAMPLE 6 | B | B | B |
| EXAMPLE 16 | S | S | S |
| EXAMPLE 17 | S | S | S |
| EXAMPLE 18 | S | S | S |
| EXAMPLE 19 | S | S | A |
| EXAMPLE 20 | A | A | A |
| EXAMPLE 21 | S | S | S |
| EXAMPLE 22 | S | S | S |
| EXAMPLE 23 | S | S | S |
| EXAMPLE 24 | S | S | A |
| EXAMPLE 25 | A | A | A |
| EXAMPLE 26 | S | S | S |
| EXAMPLE 27 | S | S | S |
| EXAMPLE 28 | S | S | S |
| EXAMPLE 29 | S | S | A |
| EXAMPLE 30 | A | A | A |

FIG.18

FUNCTIONAL LAYER FORMING COMPOSITION, METHOD FOR PRODUCING FUNCTIONAL LAYER FORMING COMPOSITION, METHOD FOR PRODUCING ORGANIC EL ELEMENT, ORGANIC EL DEVICE, AND ELECTRONIC APPARATUS

TECHNICAL FIELD

The present invention relates to a functional layer forming composition, a method for producing a functional layer forming composition, a method for producing an organic EL element, an organic EL device, and an electronic apparatus.

BACKGROUND ART

As a functional layer forming composition, for example, in PTL 1, a coating liquid for organic EL use, which is used when at least one organic layer in an organic EL (Electro-Luminescence) element is formed by a printing method, and contains at least one type of solvent having a vapor pressure of 500 Pa or less is disclosed.

According to the above PTL 1, as the printing method, offset printing is exemplified, and as the solvent having a vapor pressure of 500 Pa or less, diethylbenzene, trimethylbenzene, triethylbenzene, and nitrobenzene are exemplified, and according to such a solvent configuration, an organic EL layer can be favorably formed by a printing method.

CITATION LIST

Patent Literature

PTL 1: JP-A-2001-155861

SUMMARY OF INVENTION

Technical Problem

As the printing method, an inkjet method in which a liquid (ink) is ejected as a liquid droplet from a nozzle of an inkjet head is exemplified. When a coating liquid for organic EL use of the above PTL 1 is ejected by an inkjet method, since the boiling point of an alkyl benzene such as diethylbenzene, trimethylbenzene, or triethylbenzene is lower than that of nitrobenzene, drying proceeds easily and nozzle clogging or the like is likely to occur, and therefore, there is a problem that it is difficult to ensure ejection stability or film flatness.

Further, nitrobenzene is a polar solvent, and has a nitro group which is an electron withdrawing group. There was a fear that when a solvent having an electron withdrawing group remains in a functional layer such as an organic EL layer after film formation, due to an interaction between the functional layer and the electron withdrawing group, the element characteristics may be affected.

Solution to Problem

The invention has been made to solve at least part of the above-mentioned problems and can be realized as the following forms or application examples.

Application Example

A functional layer forming composition according to this application example is a functional layer forming composition, which is used when at least one layer in a functional layer containing an organic material is formed by a liquid phase process, and is characterized in that the method includes a solid component for forming a functional layer, a first aromatic solvent having an electron withdrawing group, and a second aromatic solvent having an electron donating group, and the boiling point of the second aromatic solvent is higher than the boiling point of the first aromatic solvent.

According to this application example, when at least one layer in a functional layer is formed by a liquid phase process, a dissolution property for the solid component is ensured by the first aromatic solvent which is a polar solvent. Then, by adding the second aromatic solvent having a higher boiling point than the first aromatic solvent, drying for removing the solvent from the functional layer forming composition (liquid) proceeds more slowly as compared with the case where the second aromatic solvent is not contained, and therefore, a functional layer forming composition capable of obtaining a stable film forming property can be provided. Further, in a process of drying of the functional layer forming composition (liquid), due to an interaction (attractive force) between the first aromatic solvent having an electron withdrawing property and the second aromatic solvent having an electron donating property, the first aromatic solvent evaporates simultaneously with the evaporation of the second aromatic solvent. Therefore, the residual first aromatic solvent in the functional layer after film formation can be reduced. That is, it is possible to prevent the first aromatic solvent having an electron withdrawing group from affecting the element characteristics by remaining in the functional layer.

In the functional layer forming composition according to the above application example, it is preferred that the boiling point of the first aromatic solvent is 200° C. or higher, and the boiling point of the second aromatic solvent is 250° C. or higher.

According to such a solvent configuration, a functional layer forming composition which exhibits ejection stability favorable for an inkjet method as the liquid phase process can be provided.

In the functional layer forming composition according to the above application example, it is preferred that the electron withdrawing group is a nitro group.

According to such a configuration of the first aromatic solvent, a high dissolution property for an organic material is exhibited.

In the functional layer forming composition according to the above application example, it is preferred that the electron donating group is an alkoxy group or an amino group.

According to such a configuration of the second aromatic solvent, a low reactivity with an organic material is exhibited. Incidentally, the alkoxy group may be bound to a phenyl group.

In the functional layer forming composition according to the above application example, it is preferred that the content ratio of the second aromatic solvent is 10% or more and 90% or less.

According to such a solvent configuration, excellent ejection stability and film flatness are obtained when using an inkjet method.

In the functional layer forming composition according to the above application example, it is preferred that the content ratio of the second aromatic solvent is equal to or more than the content ratio of the first aromatic solvent.

According to such a solvent configuration, when the functional layer forming composition is dried after it is applied, by evaporating the second aromatic solvent, the first aromatic solvent can be reliably evaporated and removed, and therefore, the first aromatic solvent can be prevented from remaining in the functional layer.

The functional layer forming composition according to the above application example is characterized in that the first aromatic solvent is at least one type selected from nitrobenzene, 2,3-dimethylnitrobenzene, and 2,4-dimethylnitrobenzene.

The functional layer forming composition according to the above application example is characterized in that the second aromatic solvent is at least one type selected from trimethoxytoluene, diphenyl ether, 3-phenoxytoluene, benzylphenyl ether, aminobiphenyl, and diphenylamine.

According to such a solvent configuration, the solvent can be relatively easily obtained.

Application Example

A method for producing a functional layer forming composition according to this application example is a method for producing a functional layer forming composition, which is used when at least one layer in a functional layer containing an organic material is formed by a liquid phase process, and is characterized in that the method includes a step of dissolving a solid component for forming a functional layer in a first aromatic solvent having an electron withdrawing group, and a step of adding a second aromatic solvent having an electron donating group to the first aromatic solvent in which the solid component for forming the functional layer is dissolved, and the boiling point of the second aromatic solvent is higher than the boiling point of the first aromatic solvent.

According to this application example, the solid component for forming the functional layer can be easily dissolved in the first aromatic solvent than in the second aromatic solvent. Further, when the obtained functional layer forming composition is applied and dried, drying proceeds more slowly as compared with the case where the second aromatic solvent is not added, and therefore, a stable film forming property is obtained. Further, due to an interaction (attractive force) between the first aromatic solvent having an electron withdrawing property and the second aromatic solvent having an electron donating property, the first aromatic solvent evaporates simultaneously with the evaporation of the second aromatic solvent. Therefore, a functional layer forming composition in which the first aromatic solvent hardly remains in the formed functional layer can be produced.

Application Example

A method for producing an organic EL element according to this application example is a method for producing an organic EL element in which a functional layer including a light emitting layer is sandwiched between a pair of electrodes, and is characterized by including a step of applying the functional layer forming composition according to the above application example onto one electrode of the pair of electrodes, and a step of forming at least one layer in the functional layer by drying and solidifying the applied functional layer forming composition.

According to this application example, an organic EL element having excellent element characteristics can be produced.

In the method for producing an organic EL element according to the above application example, it is preferred that in the step of applying the functional layer forming composition, the functional layer forming composition is applied to a film forming region on the one electrode by an inkjet method.

According to this method, a necessary amount of the composition can be ejected to a film forming region from a nozzle of an inkjet head without any waste, and excellent film flatness is obtained.

Application Example

An organic EL device according to this application example is characterized by including an organic EL element produced using the method for producing an organic EL element according to the above application example.

According to this application example, an organic EL device having excellent electrooptical characteristics can be provided.

Application Example

An electronic apparatus according to this application example is characterized by including an organic EL device according to the above application example.

According to this application example, an electronic apparatus having excellent electrooptical characteristics can be provided.

BRIEF DESCRIPTION OF DRAWINGS

FIGS. 5(a) to 5(d) are tables of evaluation results showing a relationship between a solvent configuration and an ink ejection property in the case where a high-molecular weight hole injection transport material was used.

FIGS. 6(e) to 6(g) are tables of evaluation results showing a relationship between a solvent configuration and an ink ejection property in the case where a high-molecular weight hole injection transport material was used.

FIGS. 7(a) to 7(d) are tables of evaluation results showing a relationship between a solvent configuration and an ink ejection property in the case where a high-molecular weight light emitting material was used.

FIGS. 8(e) to 8(g) are tables of evaluation results showing a relationship between a solvent configuration and an ink ejection property in the case where a high-molecular weight light emitting material was used.

FIGS. 9(a) to 9(d) are tables of evaluation results showing a relationship between a solvent configuration and film flatness in the case where a high-molecular weight hole injection transport material was used.

FIGS. 10(e) to 10(g) are tables of evaluation results showing a relationship between a solvent configuration and film flatness in the case where a high-molecular weight hole injection transport material was used.

FIGS. 11(a) to 11(d) are tables of evaluation results showing a relationship between a solvent configuration and film flatness in the case where a high-molecular weight light emitting material was used.

FIGS. 12(e) to 12(g) are tables of evaluation results showing a relationship between a solvent configuration and film flatness in the case where a high-molecular weight light emitting material was used.

FIGS. 13(a) to 13(d) are tables of evaluation results showing a relationship between a solvent configuration and film flatness in the case where a low-molecular weight hole injection transport material was used.

FIGS. 14(e) to 14(g) are tables of evaluation results showing a relationship between a solvent configuration and film flatness in the case where a low-molecular weight hole injection transport material was used.

FIGS. 15(a) to 15(d) are tables of evaluation results showing a relationship between a solvent configuration and film flatness in the case where a low-molecular weight light emitting material was used.

FIGS. 16(e) to 16(g) are tables of evaluation results showing a relationship between a solvent configuration and film flatness in the case where a low-molecular weight light emitting material was used.

FIG. 17 is a table showing evaluation results of element characteristics of organic EL elements of Comparative Example 1 to Comparative Example 3 and Example 1 to Example 15.

FIG. 18 is a table showing evaluation results of element characteristics of organic EL elements of Comparative Example 4 to Comparative Example 6 and Example 16 to Example 30.

DESCRIPTION OF EMBODIMENTS

Hereinafter, embodiments embodying the invention will be described with reference to the drawings. Incidentally, the drawings to be used are displayed by being enlarged or reduced as appropriate so that a portion to be described is in a recognizable state.

First Embodiment

<Organic EL Device>

Figure 1:
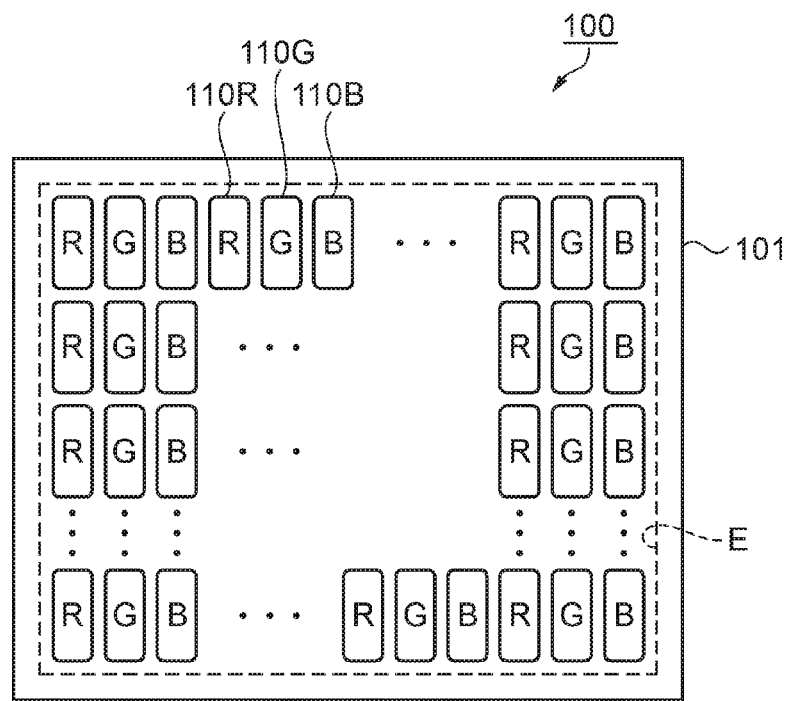
FIG. 1 is a schematic plan view showing a configuration of an organic EL device.
Figure 2:
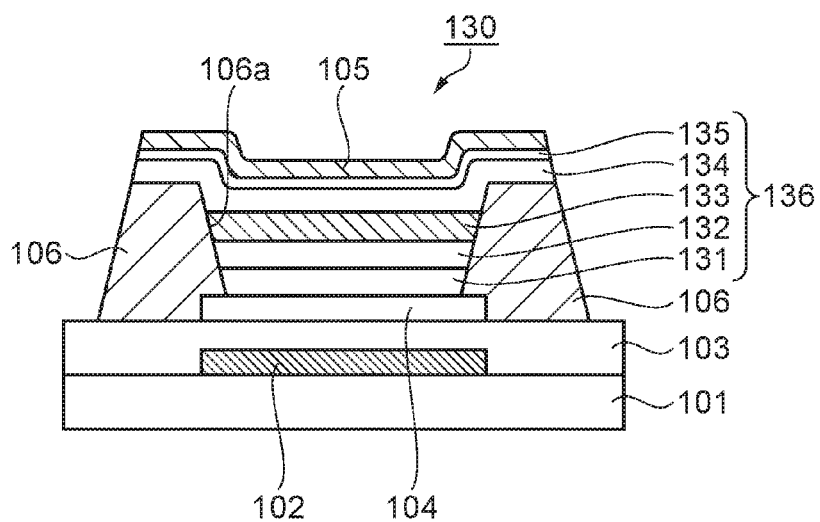
FIG. 2 is a schematic cross-sectional view showing a configuration of an organic EL element.

First, an organic EL device including an organic EL element of this embodiment will be described with reference to FIG. 1 and FIG. 2. FIG. 1 is a schematic plan view showing a configuration of the organic EL device, and FIG. 2 is a schematic cross-sectional view showing a configuration of the organic EL device.

As shown in FIG. 1, an organic EL device 100 of this embodiment includes an element substrate 101 on which sub-pixels 110R, 110G, and 110B from which red (R), green (G), and blue (B) light emission (light emission color) is obtained are arranged. Each of the sub-pixels 110R, 110G, and 110B has a substantially rectangular shape, and is arranged in a matrix form in a display region E of the element substrate 101. Hereinafter, the sub-pixels 110R, 110G, and 110B are also sometimes collectively referred to as "sub-pixel 110". The sub-pixels 110 which emit light of the same color are arranged in a vertical direction in the drawing (in a column direction or in a long-side direction of the sub-pixel 110), and the sub-pixels 110 which emit light of a different color are arranged in a horizontal direction in the drawing (in a line direction or in a short-side direction of the sub-pixel 110) in the order of R, G, and B. That is, the sub-pixels 110R, 110G, and 110B which emit light of a different color are arranged in a so-called stripe pattern. Incidentally, the planar shape and arrangement of the sub-pixels 110R, 110G, and 110B are not limited thereto. Further, the substantially rectangular shape includes, in addition to a square shape and a rectangular shape, a quadrangular shape with rounded corners and a quadrangular shape whose two opposing sides are arcuate.

An organic EL element from which red (R) light emission is obtained is provided in the sub-pixel 110R. Similarly, an organic EL element from which green (G) light emission is obtained is provided in the sub-pixel 110G, and an organic EL element from which blue (B) light emission is obtained is provided in the sub-pixel 110B.

In such an organic EL device 100, the three sub-pixels 110R, 110G, and 110B from which different light emission colors are obtained are taken as one display pixel unit, and the respective sub-pixels 110R, 110G, and 110B are electrically controlled. According to this, full color display can be achieved.

In each of the sub-pixels 110R, 110G, and 110B, an organic EL element 130 shown in FIG. 2 is provided. The organic EL element 130 includes a reflection layer 102 provided on the element substrate 101, an insulating film 103, a pixel electrode 104, a counter electrode 105, and a functional layer 136 which is provided between the pixel electrode 104 and the counter electrode 105 and includes a light emitting layer 133.

The pixel electrode 104 functions as an anode, and is provided for each of the sub-pixels 110R, 110G, and 110B, and is formed using a transparent conductive film of, for example, ITO (Indium Tin Oxide) or the like.

The reflection layer 102 provided in the lower layer of the pixel electrode 104 reflects light transmitted through the pixel electrode 104 having a light transmission property and emitted from the functional layer 136 back to the pixel electrode 104 side. The reflection layer 102 is formed using a metal having light reflectivity, for example, aluminum (Al), silver (Ag), or the like, or an alloy thereof, or the like. Therefore, in order to prevent an electrical short circuit between the reflection layer 102 and the pixel electrode 104, the insulating film 103 that covers the reflection layer 102 is provided. The insulating film 103 is formed using, for example, silicon oxide, silicon nitride, silicon oxynitride, or the like.

The functional layer 136 is a layer obtained by stacking a hole injection layer 131, a hole transport layer 132, a light emitting layer 133, an electron transport layer 134, and an electron injection layer 135 in this order from the pixel electrode 104 side. In particular, the constituent material of the light emitting layer 133 is selected according to the light emission color, however, here, it is collectively referred to as "light emitting layer 133" regardless of the light emission color. Incidentally, the configuration of the functional layer 136 is not limited thereto, and an intermediate layer or the like which controls the transfer of a carrier (a hole or an electron) may be included in addition to these layers.

The counter electrode 105 functions as a cathode, and is provided as a common electrode shared by the sub-pixels 110R, 110G, and 110B, and is formed using an alloy of Al (aluminum) or Ag (silver) and Mg (magnesium), or the like.

A hole is injected as a carrier into the light emitting layer 133 from the pixel electrode 104 side as the anode, and an electron is injected as a carrier into the light emitting layer 133 from the counter electrode 105 side as the cathode. An exciton (in a state where a hole and an electron are bound to each other by a Coulomb force) is formed by a hole and an electron injected in the light emitting layer 133, and when the exciton disappears (when a hole and an electron are recombined with each other), part of energy is converted into fluorescence or phosphorescence and released.

In the organic EL device 100, if the counter electrode 105 is configured to have a light transmission property, since the reflection layer 102 is included, it is possible to extract light emitted from the light emitting layer 133 from the counter electrode 105 side. Such a light emission type is referred to as "top emission type". Further, if the reflection layer 102 is eliminated and the counter electrode 105 is configured to have light reflectivity, it is also possible to provide a bottom emission type in which light emitted from the light emitting layer 133 is extracted from the element substrate 101 side. In this embodiment, a case where the organic EL device 100 is a top emission type device will be described below. The organic EL device 100 of this embodiment is an active driving type light emitting device which includes a pixel circuit capable of independently driving each organic EL element 130 for each of the sub-pixels 110R, 110G, and 110B on the element substrate 101. Since the pixel circuit can adopt a known configuration, the illustration of the pixel circuit is omitted in FIG. 2.

The organic EL device 100 in this embodiment has a partition wall 106 which overlaps with the outer edge of the pixel electrode 104 in the organic EL element 130 for each of the sub-pixels 110R, 110G, and 110B and forms an opening portion 106a on the pixel electrode 104.

In the functional layer 136 of the organic EL element 130 in this embodiment, at least one layer of the hole injection layer 131, the hole transport layer 132, and the light emitting layer 133 constituting the functional layer 136 is formed by a liquid phase process. The liquid phase process is a method for forming each layer by applying a solution (functional layer forming composition) containing a component constituting each layer and a solvent to the opening portion 106a as a film forming region surrounded by the partition wall 106 and drying. In order to form each layer at a desired film thickness, it is necessary to accurately apply a predetermined amount of the functional layer forming composition to the opening portion 106a, and in this embodiment, an inkjet method (liquid droplet ejection method) is adopted as the liquid phase process.

In particular, in the organic EL device 100 of a top emission type, it is preferred that the cross-sectional shape of each layer constituting the functional layer 136 is flat. The functional layer forming composition of this embodiment is used such that a predetermined amount of the functional layer forming composition is uniformly applied to the opening portion 106a and dried so as to make the cross-sectional shape of each layer flat. In order to ensure the ejection stability when using an inkjet method in which the functional layer forming composition is ejected from a nozzle of an inkjet head, and the film flatness of the functional layer 136 in the opening portion 106a, the solvent configuration in the functional layer forming composition is devised. The detailed configuration of the functional layer forming composition will be described later.

<Method for Producing Organic EL Element>

Next, a method for producing an organic EL element as a light emitting element of this embodiment will be specifically described with reference to FIG. 3. FIGS. 3(a) to 3(d) are schematic cross-sectional views showing a method for producing an organic EL element. Incidentally, as described above, as a method for forming the pixel circuit which drives and controls the organic EL element 130, the reflection layer 102, or the pixel electrode 104, a known method can be adopted, and therefore, a step of forming a partition wall and the subsequent steps will be described here.

The method for producing the organic EL element 130 of this embodiment includes a partition wall formation step (Step S1), a surface treatment step (Step S2), a functional layer formation step (Step S3), and a counter electrode formation step (Step S4).

Figure 3A:
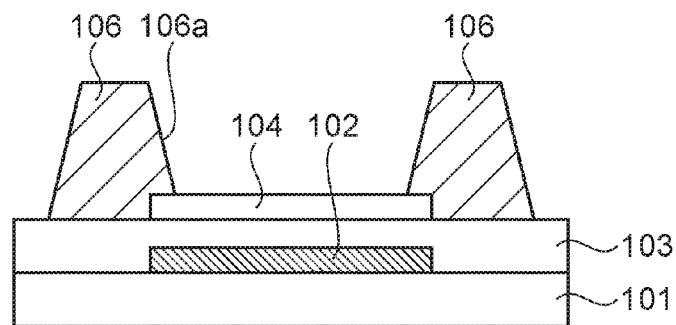
FIGS. 3(a) to 3(d) are schematic cross-sectional views showing a method for producing an organic EL element.

In the partition wall formation step of Step S1, as shown in FIG. 3(a), a photosensitive resin layer is formed on the element substrate 101 on which the reflection layer 102 and the pixel electrode 104 are formed by, for example, applying a photosensitive resin material containing a liquid repellent material having liquid repellency to the functional layer forming composition to a thickness of 1 µm to 2 µm, followed by drying. Examples of the application method include a transfer method and a slit coating method. Examples of the liquid repellent material include fluorine compounds and siloxane-based compounds. Examples of the photosensitive resin material include negative polyfunctional acrylic resins. The thus formed photosensitive resin layer is exposed to light and developed using an exposure mask corresponding to the shape of the sub-pixels 110, whereby the partition wall 106 which overlaps with the outer edge of the pixel electrode 104, and also forms the opening portion 106a on the pixel electrode 104 is formed. Then, the process proceeds to Step S2.

In the surface treatment step of Step S2, the element substrate 101 on which the partition wall 106 is formed is subjected to a surface treatment. The surface treatment step is performed for the purpose of removing unnecessary materials such as partition wall residues on the surface of the pixel electrode 104 so that the functional layer forming composition containing a functional layer forming material (solid component) wets and spreads uniformly in the opening portion 106a surrounded by the partition wall 106 when forming the hole injection layer 131, the hole transport layer 132, and the light emitting layer 133 constituting the functional layer 136 by an inkjet method (liquid droplet ejection method) in the subsequent step. In this embodiment, an excimer UV (ultraviolet ray) treatment is performed as the surface treatment method. The surface treatment method is not limited to the excimer UV treatment and may be any as long as the surface of the pixel electrode 104 can be cleaned, and for example, a washing and drying step may be performed using a solvent. If the surface of the pixel electrode 104 is in a clean state, it is not necessary to perform the surface treatment step. Incidentally, in this embodiment, the partition wall 106 is formed using a photosensitive resin material containing a liquid repellent material, however, the invention is not limited thereto, and after forming the partition wall 106 using a photosensitive resin material which does not contain a liquid repellent material, liquid repellency is imparted to the surface of the partition wall 106 by performing, for example, a plasma treatment using a fluorine-based treatment gas in Step S2, and thereafter, a surface treatment for making the surface of the pixel electrode 104 lyophilic may be performed by performing a plasma treatment using oxygen as a treatment gas. Then, the process proceeds to Step S3.

Figure 3B:
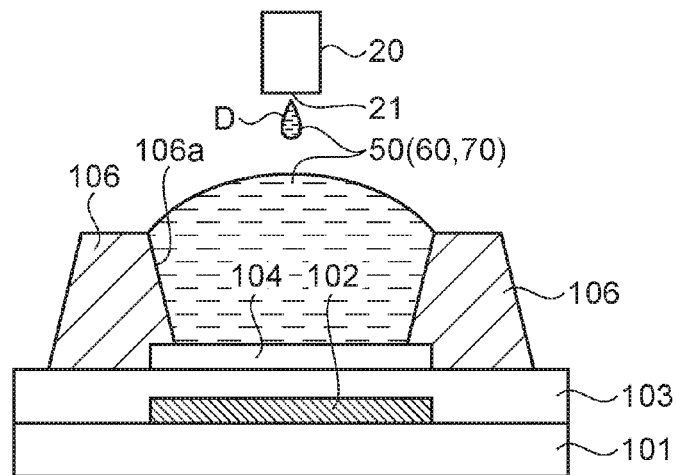

In the functional layer formation step of Step S3, first, as shown in FIG. 3(b), a hole injection layer forming ink 50 as the functional layer forming composition containing a hole injection material is applied to the opening portion 106a. As the method for applying the hole injection layer forming ink 50, an inkjet method (liquid droplet ejection method) in which the hole injection layer forming ink 50 is ejected as a liquid droplet D from the nozzle 21 of the inkjet head 20 is used. The ejection amount of the liquid droplet D ejected from the inkjet head 20 can be controlled in picoliter (pl) order, and the liquid droplets D whose number is calculated by dividing a predetermined amount by the ejection amount of the liquid droplet D is ejected to the opening portion 106a. The ejected hole injection layer forming ink 50 rounds up in the opening portion 106a due to an interfacial surface tension between the ink and the partition wall 106, but never overflows. In other words, the concentration of the hole injection material in the hole injection layer forming ink 50 is adjusted in advance so that the predetermined amount does not cause overflowing of the ink from the opening portion 106a. Then, the process proceeds to the drying step.

Figure 3C:
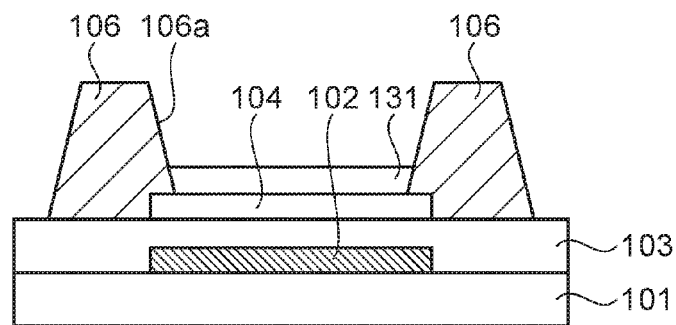

In the drying step, for example, decompression drying in which the element substrate 101 to which the hole injection layer forming ink 50 is applied is left under reduced pressure and dried by evaporating the solvent from the hole injection layer forming ink 50 is used (a decompression drying step). Thereafter, the ink is solidified by performing a firing treatment of heating under atmospheric pressure to, for example, 180° C. for 30 minutes, whereby the hole injection layer 131 is formed as shown in FIG. 3(c). The hole injection layer 131 is formed with a film thickness of about 10 nm to 30 nm, although not necessarily limited thereto in relation to the selection of the below-mentioned hole injection material or the other layers in the functional layer 136.

Subsequently, the hole transport layer 132 is formed using a hole transport layer forming ink 60 as the functional layer forming composition containing a hole transport material. The method for forming the hole transport layer 132 is also performed using an inkjet method (liquid droplet ejection method) similarly to the hole injection layer 131. That is, a predetermined amount of the hole transport layer forming ink 60 is ejected as a liquid droplet D from the nozzle 21 of the inkjet head 20 to the opening portion 106a. Then, the hole transport layer forming ink 60 applied to the opening portion 106a is dried under reduced pressure. Thereafter, a firing treatment of heating to, for example, 180° C. for 30 minutes in an inert gas environment such as nitrogen is performed, whereby the hole transport layer 132 is formed. The hole transport layer 132 is formed with a film thickness of about 10 nm to 20 nm, although not necessarily limited thereto in relation to the selection of the below-mentioned hole transport material or the other layers in the functional layer 136. Further, the hole injection layer 131 and the hole transport layer 132 may be combined to form a hole injection transport layer in relation to the other layers in the functional layer 136.

Subsequently, the light emitting layer 133 is formed using a light emitting layer forming ink 70 as the functional layer forming composition containing a light emitting layer forming material. The method for forming the light emitting layer 133 is also performed using an inkjet method (liquid droplet ejection method) similarly to the hole injection layer 131. That is, a predetermined amount of the light emitting layer forming ink 70 is ejected as a liquid droplet D from the nozzle 21 of the inkjet head 20 to the opening portion 106a. Then, the light emitting layer forming ink 70 applied to the opening portion 106a is dried under reduced pressure. Thereafter, a firing treatment of heating to, for example, 130° C. for 30 minutes in an inert gas environment such as nitrogen is performed, whereby the light emitting layer 133 is formed. The light emitting layer 133 is formed with a film thickness of about 60 nm to 80 nm, although not necessarily limited thereto in relation to the selection of the below-mentioned light emitting layer forming material or the other layers in the functional layer 136.

Subsequently, the electron transport layer 134 is formed to cover the light emitting layer 133. An electron transport material constituting the electron transport layer 134 is not particularly limited, however, examples thereof include BAlq, 1,3,5-tri(5-(4-tert-butylphenyl)-1,3,4-oxadiazole) (OXD-1), BCP (Bathocuproine), 2-(4-biphenyl)-5-(4-tert-butylphenyl)-1,2,4-oxadiazole (PBD), 3-(4-biphenyl)-5-(4-tert-butylphenyl)-1,2,4-triazole (TAZ), 4,4'-bis(1,1-bis-diphenylethenyl)biphenyl (DPVBi), 2,5-bis(1-naphthyl)-1,3,4-oxadiazole (BND), 4,4'-bis(1,1-bis(4-methylphenyl)ethenyl)biphenyl (DTVBi), and 2,5-bis(4-biphenylyl)-1,3,4-oxadiazole (BBD) so that the electron transport layer 134 can be formed using a gas phase process such as a vacuum deposition method.

Additional examples thereof include tris(8-quinolinolato) aluminum (Alq3), oxadiazole derivatives, oxazole derivatives, phenanthroline derivatives, anthraquinodimethane derivatives, benzoquinone derivatives, naphthoquinone derivatives, anthraquinone derivatives, tetracyanoanthraquinodimethane derivatives, fluorene derivatives, diphenyldicyanoethylene derivatives, diphenoquinone derivatives, and hydroxyquinoline derivatives. Among these, it is possible to use one type or two or more types in combination.

The electron transport layer 134 is formed with a film thickness of about 20 nm to 40 nm, although not necessarily limited thereto in relation to the selection of the above-mentioned electron transport material or the other layers in the functional layer 136. According to this, electrons injected from the counter electrode 105 as a cathode can be preferably transported to the light emitting layer 133. Incidentally, it is also possible to delete the electron transport layer 134 in relation to the other layers in the functional layer 136.

Subsequently, the electron injection layer 135 is formed to cover the electron transport layer 134. An electron injection material constituting the electron injection layer 135 is not particularly limited, however, examples thereof include alkali metal compounds and alkaline earth metal compounds so that the electron injection layer 135 can be formed using a gas phase process such as a vacuum deposition method.

Examples of the alkali metal compounds include alkali metal salts such as LiF, $Li_2CO_3$, LiCl, NaF, $Na_2CO_3$, NaCl, CsF, $Cs_2CO_3$, and CsCl. Examples of the alkaline earth metal compounds include alkaline earth metal salts such as $CaF_2$, $CaCO_3$, $SrF_2$, $SrCO_3$, $BaF_2$, and $BaCO_3$. Among these alkali metal compounds and alkaline earth metal compounds, it is possible to use one type or two or more types in combination.

The film thickness of the electron injection layer 135 is not particularly limited, but is preferably about 0.01 nm or more and 10 nm or less, more preferably about 0.1 nm or more and 5 nm or less. According to this, electrons can be efficiently injected from the counter electrode 105 as a cathode to the electron transport layer 134.

Subsequently, in the counter electrode formation step of Step S4, the counter electrode 105 is formed as a cathode to cover the electron injection layer 135. It is preferred to use a material with a low work function as the constituent material of the counter electrode 105, and, for example, Li, Mg, Ca, Sr, La, Ce, Er, Eu, Sc, Y, Yb, Ag, Cu, Al, Cs, Rb, Au, or an alloy containing any of these metals, or the like is used so that the counter electrode 105 can be formed using a gas phase process such as a vacuum deposition method, and among these, it is possible to use one type or two or more types in combination (for example, a stacked body of a plurality of layers, or the like).

In particular, as in this embodiment, in the case where the organic EL device 100 is a top emission type device, it is preferred to use a metal such as Mg, Al, Ag, or Au, or an alloy such as MgAg, MgAl, MgAu, or AlAg as the constituent material of the counter electrode 105. It is possible to achieve improvement of the electron injection efficiency and stability of the counter electrode 105 while maintaining the light transmission property of the counter electrode 105 by using such a metal or an alloy.

The film thickness of the counter electrode 105 in the top emission type device is not particularly limited, but is preferably about 1 nm or more and 50 nm or less, more preferably about 5 nm or more and 20 nm or less.

In the case where the organic EL device 100 is a bottom emission type device, a light transmission property is not required for the counter electrode 105. Therefore, for example, a metal or an alloy such as Al, Ag, AlAg, or AlNd is preferably used. By using such a metal or an alloy as the constituent material of the counter electrode 105, the electron injection efficiency and stability of the counter electrode 105 can be improved.

The film thickness of the counter electrode 105 in the bottom emission type device is not particularly limited, but is preferably about 50 nm or more and 1000 nm or less, more preferably about 100 nm or more and 500 nm or less.

Figure 3D:
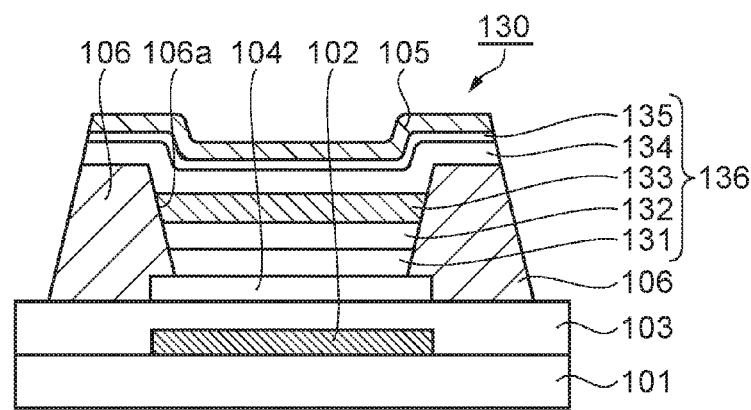

As shown in FIG. 3(d), when, for example, moisture, oxygen, or the like enters from the outside, the light emitting function in the functional layer 136 of the organic EL element 130 formed by the above production method is impaired, and the luminous brightness is partially lowered, or a dark point (dark spot) which does not emit light is generated. There is also a concern that the emission lifetime is shortened. Therefore, in order to protect the organic EL element 130 from the entry of moisture, oxygen, or the like, it is preferred to cover the organic EL element 130 with a sealing layer (not shown). As the sealing layer, for example, an inorganic insulating material such as silicon oxynitride (SiON) with low permeability to water, oxygen, or the like can be used. Further, the organic EL element 130 may be sealed by, for example, attaching a sealing substrate such as a transparent glass to the element substrate 101 on which the organic EL element 130 is formed through an adhesive.

In the above-mentioned method for producing the organic EL element 130, the hole injection layer 131, the hole transport layer 132, and the light emitting layer 133 in the functional layer 136 are formed by a liquid phase process (inkjet method), however, it is only necessary to form one of these layers by a liquid phase process (inkjet method), and the other layers may be formed by a gas phase process such as vacuum deposition.

Next, the constituent materials, which can be used in a liquid phase process or a gas phase process, of the hole injection layer 131, the hole transport layer 132, and the light emitting layer 133 will be described.

[Hole Injection Transport Materials (HIL and HTL Materials)

Preferred hole injection transport materials for forming the hole injection layer (HIL) 131 and the hole transport layer (HTL) 132 are not particularly limited, however, various types of p-type high-molecular weight materials and various types of p-type low-molecular weight materials can be used alone or in combination.

Examples of the p-type high-molecular weight materials (organic polymers) include aromatic amine-based compounds having an arylamine skeleton such as polyarylamines including poly(2,7-(9,9-di-n-octylfluorene)-(1,4-phenylene-((4-sec-butylphenyl)imino)-1,4-phenylene (TFB) and the like, polyfluorene derivatives (PF) having a fluorene skeleton such as a fluorene-bithiophene copolymer and polyfluorene derivatives (PF) having both of an arylamine skeleton and a fluorene skeleton such as a fluorene-arylamine copolymer, poly(N-vinylcarbazole) (PVK), polyvinyl pyrene, polyvinyl anthracene, polythiophene, polyalkylthiophene, polyhexylthiophene, poly(p-phenylene vinylene) (PPV), polythienylene vinylene, a pyrene formaldehyde resin, an ethylcarbazole formaldehyde resin and derivatives thereof, polysilane-based compounds such as polymethylphenylsilane (PMPS), poly[bis(4-phenyl) (2,4,6-trimethylphenyl)amine (PITA), and poly[N,N'-bis(4-butylphenyl)-N,N'-bis(phenyl)-benzidine].

Such a p-type high-molecular weight material can also be used as a mixture with another compound. For example, as a mixture containing polythiophene, poly(3,4-ethylenedioxythiophene)/polystyrene sulfonic acid) (PEDOT/PSS), an electrically conductive polymer VERAZOL (registered trademark) manufactured by Soken Chemical & Engineering Co., Ltd. or the like, and ELsource (registered trademark) manufactured by Nissan Chemical Industries, Ltd. as polyaniline can be exemplified.

Examples of the p-type low-molecular weight materials include arylcycloalkane-based compounds such as 1,1-bis(4-di-para-tolylaminophenyl)cyclohexane and 1,1'-bis(4-di-para-tolylaminophenyl)-4-phenyl-cyclohexane (TAPC), arylamine-based compounds such as 4,4',4''-trimethyltriphenylamine, N,N'-diphenyl-N,N'-bis(3-methylphenyl)-1,1'-biphenyl-4,4'-diamine (TPD), N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), a triphenylamine tetramer (TPTE), 1,3,5-tris[4-(diphenylamino)benzene (TDAPB), tris(4-(carbazol-9-yl-phenyl)amine (spiro-TAD), tris-p-tolylamine (HTML), 1,1-bis[(di-4-tolylamino)phenyl]cyclohexane (HTM2), and N4,N4'-(biphenyl-4,4'-diyl)bis(N4,N4,N4'-triphenylbiphenyl-4,4'-diamine) (TPT1), phenylenediamine-based compounds such as N,N,N',N'-tetraphenyl-para-phenylenediamine, N,N,N',N'-tetra(para-tolyl)-para-phenylenediamine, N,N,N',N'-tetra(meta-tolyl)-meta-phenylenediamine (PDA), PDA-Si (Mol. Cryst. Liq. Cryst. Vol. 462. pp. 249-256, 2007), and N,N'-diphenyl-1,4-phenylenediamine (DPPD), carbazole-based compounds such as carbazole, N-isopropylcarbazole, N-phenylcarbazole, and VB-TCA (Adv. Mater. 2007, 19, 300-304), stilbene-based compounds such as stilbene and 4-di-para-tolylaminostilbene, oxazole-based compounds such as OxZ, triphenylmethane-based compounds such as triphenylmethane, 4,4',4''-tris[N-3-methylphenyl-N-phenylamino)triphenylamine (m-MTDATA), 4,4',4''-tris(N,N-(2-naphthyl)phenylamino)triphenylamine (2-TNATA), and 4,4',4''-tri(N-carbazolyl)triphenylamine (TCTA), pyrazoline-based compounds such as 1-phenyl-3-(para-dimethylaminophenyl)pyrazoline, benzine(cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithioketo-3,6-diphenyl-pyrro-(3,4-c)pyrropyrrole, fluorene-based compounds such as fluorene, porphyrin-based compounds such as porphyrin and metal tetraphenyl porphyrins, quinacridone-based compounds such as quinacridone, metal or non-metal phthalocyanine-based compounds such as phthalocyanine, copper phthalocyanine (CuPc), tetra(t-butyl) copper phthalocyanine, and iron phthalocyanine, metal or non-metal naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine. Incidentally, PDA-Si is used by adding a cationic polymerizable compound: xylene bisoxetane (ARONE OXETANE OXT-121, Toagosei Co., Ltd.) and a radical polymerization initiator: an aliphatic diacyl peroxide (PEROYL L, NOF Corporation) in order to achieve polymerization.

Next, a light emitting material (EML material) from which fluorescence or phosphorescence is obtained will be described by showing specific examples for each light emission color.

[Red Light Emitting Material]

First, a red light emitting material is not particularly limited, and various types of red fluorescent materials and red phosphorescent materials can be used alone or two or more types thereof can be used in combination.

The red fluorescent material is not particularly limited as long as it emits red fluorescence, and examples thereof include perylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N, N'-diphenylamino)-1,4-phenylene}], and poly[{2-methoxy-5-(2-ethylhexyloxy)-1,4-(1-cyanovinylenephenylene)}-co{2,5-bis(N,N'-diphenylamino)-1,4-phenylene}].

The red phosphorescent material is not particularly limited as long as it emits red phosphorescence, and examples thereof include metal complexes such as complexes of iridium, ruthenium, platinum, osmium, rhenium, and palladium, and metal complexes in which at least one of the ligands of such a metal complex has a phenylpyridine skeleton, a bipyridyl skeleton, a porphyrin skeleton or the like. More specific examples thereof include tris(1-phenylisoquinoline)iridium, bis[2-(2'-benzo[4,5-α]thienyl)pyridinato-N,C3']iridium (acetylacetonate) (Btp2Ir(acac)), 2,3,7,8,12,13,17,18-octaethyl-12H,23H-porphyrin-platinum (II), fac-tris(2-phenyl)-bis(2-(2'-benzo[4,5-α]thienyl)-pyridinato-N,C3') iridium (acetylacetonate) (Bt2Ir(acac)), and bis(2-phenylpyridine) iridium (acetylacetonate).

Further, the red light emitting layer 133 may contain, in addition to the above-mentioned red light emitting material, a host material to which the red light emitting material is added as a guest material.

The host material has a function to generate an exciton by recombining a hole and an electron with each other, and also to excite the red light emitting material by transferring the energy of the exciton to the red light emitting material (Forster transfer or Dexter transfer). In the case where such a host material is used, for example, the red light emitting material which is the guest material can be used by doping the host material with the red light emitting material as a dopant.

Such a host material is not particularly limited as long as it has a function as described above for the red light emitting material to be used, however, in the case where the red light emitting material contains a red fluorescent material, examples thereof include acene derivatives (acene-based materials) such as naphthacene derivatives, naphthalene derivatives, and anthracene derivatives, distyrylarylene derivatives, perylene derivatives, distyrylbenzene derivatives, distyrylamine derivatives, quinolinolate-based metal complexes (BAql) such as tris(8-quinolinolato)aluminum complex (Alq3), triarylamine derivatives (TDAPB) such as triphenylamine tetramers, oxadiazole derivatives, silole derivatives (SimCP and UGH3), dicarbazole derivatives (CBP, mCP, CDBP, and DCB), oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi), and phosphorus derivatives (PO6). Among these, it is possible to use one type or two or more types in combination.

In the case where the red light emitting material (guest material) and the host material as described above are used, the content (doping amount) of the red light emitting material in the red light emitting layer 133 is preferably from 0.01 to 10 wt %, more preferably from 0.1 to 5 wt %. By setting the content of the red light emitting material within such a range, the luminous efficiency can be optimized.

[Green Light Emitting Material]

A green light emitting material is not particularly limited, and examples thereof include various types of green fluorescent materials and green phosphorescent materials, and among these, it is possible to use one type or two or more types in combination.

The green fluorescent material is not particularly limited as long as it emits green fluorescence, and examples thereof include coumarin derivatives, quinacridone and derivatives thereof, 9,10-bis[(9-ethyl-3-carbazole)-vinylenyl]-anthracene, poly(9,9-dihexyl-2,7-vinylenefluorenylene), poly[(9, 9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-alt-co-(2-methoxy-5-(2-ethoxylhexyloxy)-1,4-phenylene)], and poly[(9,9-dioctylfluorene-2,7-diyl)-alt-co-(1,4-benzo-{2,1',3}-thiadiazole)] (F8BT).

The green phosphorescent material is not particularly limited as long as it emits green phosphorescence, and examples thereof include metal complexes such as complexes of iridium, ruthenium, platinum, osmium, rhenium, and palladium, and specific examples thereof include fac-tris(2-phenylpyridine)iridium (Ir(ppy)3), bis(2-phenylpyridinato-N,C2')iridium (acetylacetonate) (Ppy2Ir (acac)), and fac-tris[5-fluoro-2-(5-trifluoromethyl-2-pyridine)phenyl-C,N] iridium.

Further, the green light emitting layer 133 may contain, in addition to the above-mentioned green light emitting material, a host material to which the green light emitting material is added as a guest material.

As such a host material, the same host materials as those described for the above-mentioned red light emitting layer 133 can be used.

[Blue Light Emitting Material]

Examples of a blue light emitting material include various types of blue fluorescent materials and blue phosphorescent materials, and among these, it is possible to use one type or two or more types in combination.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, and 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxylhexyloxy}phenylene-1,4-diyl)], poly[(9,9-dioctylfluorene-2,7-diyl)-co-(ethynylbenzene)], and poly[(9,9-dioctylfluorene-2,7-diyl)-co-(N,N'-diphenyl)-N,N'-di(para-butylphenyl)-1,4-diamino-benzene]].

The blue phosphorescent material is not particularly limited as long as it emits blue phosphorescence, and examples thereof include metal complexes such as complexes of iridium, ruthenium, platinum, osmium, rhenium, and palladium, and specific examples thereof include bis[4,6-difluorophenylpyridinato-N,C2']-picolinate-iridium (FIrpic), tris(1-phenyl-3-methylbenzimidazolin-2-ylidene-C,C2') (Ir(pmb)3), bis(2,4-difluorophenylpyridinato) (5-(pyridin-2-yl)-1H-tetrazole)iridium (FIrN4), tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium (acetylacetonate).

Further, the blue light emitting layer 133 may contain, in addition to the above-mentioned blue light emitting material, a host material to which the blue light emitting material is added as a guest material.

As such a host material, the same host materials as those described for the above-mentioned red light emitting layer 133 can be used.

In this embodiment, the low-molecular weight substance refers to a substance having a molecular weight of less than 1000, and the high-molecular weight substance refers to a substance having a molecular weight of 1000 or more and having a repeated structure of a basic skeleton.

<Functional Layer Forming Composition>

Next, the functional layer forming composition of this embodiment will be described. The basic configuration of a preferred functional layer forming composition when forming each of the hole injection layer 131, the hole transport layer 132, and the light emitting layer 133 in the functional layer 136 of the organic EL element 130 of this embodiment by a liquid phase process (inkjet method) is as follows.

The functional layer forming composition includes a solid component for forming a functional layer, a first aromatic solvent having an electron withdrawing group, and a second aromatic solvent having an electron donating group, and in which the boiling point of the second aromatic solvent is higher than the boiling point of the first aromatic solvent.

Further, when using an inkjet method, the solvents are selected and the content ratio is set in consideration that the functional layer forming composition can be stably ejected from a nozzle of an inkjet head (ejection stability) and the film flatness of the formed functional layer 136 can be obtained. Further, the solvents are selected and the content ratio is set so that desired element characteristics are obtained in the organic EL element 130 including the formed functional layer 136.

<First Aromatic Solvent>

The first aromatic solvent having an electron withdrawing group has an excellent dissolution property (is a good solvent) for a solid component (organic EL material) for forming a functional layer, and preferably has a boiling point (bp) of 200° C. or higher in consideration of ejection stability. Specific examples thereof include nitrobenzene (bp: 210° C.), 2,3-dimethylnitrobenzene (bp: 245° C.), and 2,4-dimethylnitrobenzene (bp: 245° C.), each of which has a nitro group (—$NO_2$ group) as the electron withdrawing group.

<Second Aromatic Solvent>

The second aromatic solvent having an electron donating group is not necessarily a good solvent for a solid component (organic EL material) for forming a functional layer, and preferably has a boiling point (bp) of 250° C. or higher which is higher than that of the first aromatic solvent. Specific examples thereof include α,α,4-trimethoxytoluene (bp: 253° C.), diphenyl ether (bp: 258° C.), 3-phenoxytoluene (bp: 272° C.), benzylphenyl ether (bp: 288° C.), aminobiphenyl (bp: 299° C.), and diphenylamine (bp: 302° C.), each of which has an alkoxy group (—OR group) or an amino group (—$NH_3$ group) as the electron donating group. Incidentally, R of the alkoxy group is not limited to an alkyl group, and may be a phenyl group. Further, in consideration of the drying property of the second aromatic solvent, the boiling point (bp) thereof is preferably 350° C. or lower.

<Method for Producing Functional Layer Forming Composition>

The method for producing a functional layer forming composition in this embodiment includes a step of dissolving a solid component for forming a functional layer in a first aromatic solvent having an electron withdrawing group, and a step of adding a second aromatic solvent having an electron donating group to the first aromatic solvent in which the solid component for forming the functional layer is dissolved. As described above, the first aromatic solvent shows a high dissolution property for the organic EL material which is the solid component for forming the functional layer, and therefore, a preparation work is completed in a shorter time when the solid component is dissolved in the first aromatic solvent than in the second aromatic solvent. Further, by adding the second aromatic solvent having a high boiling point to the first aromatic solvent, it is possible to produce a functional layer forming composition which is chemically stable and is easy to handle.

Next, specific evaluation methods for ejection stability and film flatness when using an inkjet method and evaluation results will be described. Incidentally, in this embodiment, the functional layer forming composition is applied using an inkjet method, and therefore, for the sake of convenience of explanation, hereinafter, the functional layer forming composition is sometimes also simply referred to as "ink".

<Evaluation of Ejection Stability>

First, an evaluation method for ejection stability and evaluation results will be described with reference to FIG. 5 to FIG. 8. FIGS. 5(*a*) to 5(*d*) and FIGS. 6(*e*) to 6(*g*) are tables of evaluation results showing a relationship between a solvent configuration and an ink ejection property in the case where a high-molecular weight hole injection transport material was used. FIGS. 7(*a*) to 7(*d*) and FIGS. 8(*e*) to 8(*g*) are tables of evaluation results showing a relationship between a solvent configuration and an ink ejection property in the case where a high-molecular weight light emitting material was used.

In the inkjet method, the higher the molecular weight of the solid component dissolved in a solvent is, the more easily the solid component is deposited when the ink in the nozzle is dried. Therefore, an evaluation method for ejection stability will be described by showing an example in which the solid component is a high-molecular weight material. When the ink is dried in the nozzle and the solid component is deposited, the nozzle clogs, and therefore, the ejection amount of a liquid droplet ejected from the nozzle becomes smaller (reduced). Therefore, in the evaluation method for ejection stability in this embodiment, when the initial ink ejection amount was taken as "1", a case where the ejection amount of a liquid droplet ejected from the nozzle after it was left for 1 hour was within a range of 0.99 or more and 1.01 or less was evaluated as "A (good)", a case where it was within a range of 0.95 or more and less than 0.99 was evaluated as "B (somewhat bad)", a case where it was less than 0.95 was evaluated as "C (bad)". As described previously, the ejection amount (volume) of one liquid droplet ejected from the nozzle of the inkjet head is in picoliter (pl) order, and in order to accurately determine the ink ejection amount, in fact, for example, tens of thousands of liquid droplets were ejected, the weight of the ejected liquid droplets was measured, and the measured weight was divided by the number of ejection operations (tens of thousands), whereby the ink ejection amount per droplet was calculated.

In FIGS. 5(a) to 5(d) and FIGS. 6(e) to 6(g), as the high-molecular weight hole injection transport material (HIL, HTL), a material was selected from the above-mentioned PVK, PF, PPV, PMPS, PITA, poly[N,N'-bis(4-butyl-phenyl)-N,N'-bis(phenyl)-benzidine], and TFB. Further, as the first aromatic solvent A, a solvent was selected from the above-mentioned nitrobenzene, 2,3-dimethylnitrobenzene, and 2,4-dimethylnitrobenzene. Further, in addition to a combination with each of the above-mentioned α,α,4-trimethoxytoluene, diphenyl ether, 3-phenoxytoluene, benzylphenyl ether, aminobiphenyl, and diphenylamine as the second aromatic solvent B, a combination with 2-methoxytoluene having a boiling point (bp) of 170° C. was evaluated. 2-Methoxytoluene has a methoxy group (—OCH$_3$ group) which is an alkoxy group as the electron donating group.

The evaluation was performed by setting the content ratio (A:B) % of the first aromatic solvent A to the second aromatic solvent B in the mixed solvent to seven ratios: 0:100, 10:90, 30:70, 50:50, 70:30, 90:10, and 100:0. Incidentally, the content ratio in this embodiment is expressed in volume (vol) %, however, the same evaluation results can be obtained also in the case where it is expressed in weight (wt) %.

As shown in FIG. 5(a), in the case where the solvent configuration was a combination of nitrobenzene with 2-methoxytoluene, the ink ejection property (ejection stability) was evaluated as "C" in all the cases regardless of the content ratio in the mixed solvent. In the case where the solvent configuration was a combination of 2,3-dimethylnitrobenzene or 2,4-dimethylnitrobenzene with 2-methoxytoluene, the ink ejection property (ejection stability) was evaluated as "C" when the content ratio in the mixed solvent was 0:100 and 10:90, and the ink ejection property (ejection stability) was evaluated as "B" when the content ratio (A:B) in the mixed solvent was 30:70, 50:50, 70:30, 90:10, and 100:0.

On the other hand, as shown in FIGS. 5(b) to 5(d) and FIGS. 6(e) to 6(g), in the case where nitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, the ink ejection property (ejection stability) was evaluated as "A" in all the cases except for the case where the content ratio (A:B) in the mixed solvent was 100:0. The ink ejection property (ejection stability) was evaluated as "C" when the content ratio (A:B) in the mixed solvent was 100:0.

In the case where 2,3-dimethylnitrobenzene or 2,4-dimethylnitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, the ink ejection property (ejection stability) was evaluated as "A" in all the cases except for the case where the content ratio (A:B) in the mixed solvent was 100:0. The ink ejection property (ejection stability) was evaluated as "B" when the content ratio (A:B) in the mixed solvent was 100:0.

In FIGS. 7(a) to 7(d) and FIGS. 8(e) to 8(g), as the high-molecular weight light emitting material (EML), each of poly[{9,9-dihexyl-2,7-bis(1-cyanovinylene)fluorenylene}-alt-co-{2,5-bis(N,N'-diphenylamino)-1,4-phenylene}] which is the above-mentioned red light emitting material (indicated by "Red-Poly-EM" in the tables for the sake of notation), poly[(9,9-dioctylfluorenyl-2,7-diyl)-alt-co-(1,4-benzo-{2,1',3}-thiadiazole)] (F8BT) which is the above-mentioned green light emitting material (indicated by "Green-Poly-EM" in the tables for the sake of notation), and poly[(9,9-dioctylfluorenyl-2,7-diyl)-co-(N,N'-diphenyl)-N, N'-di(pbutylphenyl)-1,4-diamino-benzene)] which is the above-mentioned blue light emitting material (indicated by "Blue-Poly-EM" in the tables for the sake of notation) was used and inks were formed. The first aromatic solvent A and the second aromatic solvent B were selected in the same manner as in the case of the high-molecular weight hole injection transport material (HIL, HTL).

As shown in FIG. 7(a), in the case where the solvent configuration was a combination of nitrobenzene with 2-methoxytoluene, the ink ejection property (ejection stability) was evaluated as "C" in all the cases regardless of the content ratio in the mixed solvent. In the case where the solvent configuration was a combination of 2,3-dimethylnitrobenzene or 2,4-dimethylnitrobenzene with 2-methoxytoluene, the ink ejection property (ejection stability) was evaluated as "C" when the content ratio (A:B) in the mixed solvent was 0:100 and 10:90, and the ink ejection property (ejection stability) was evaluated as "B" when the content ratio (A:B) in the mixed solvent was 30:70, 50:50, 70:30, 90:10, and 100:0.

On the other hand, as shown in FIGS. 7(b) to 7(d) and FIGS. 8(e) to 8(g), in the case where nitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, the ink ejection property (ejection stability) was evaluated as "A" in all the cases except for the case where the content ratio (A:B) in the mixed solvent was 100:0. The ink ejection property (ejection stability) was evaluated as "C" when the content ratio (A:B) in the mixed solvent was 100:0.

In the case where 2,3-dimethylnitrobenzene or 2,4-dimethylnitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, the ink ejection property (ejection stability) was evaluated as "A" in all the cases except for the case where the content ratio (A:B) in the mixed solvent was 100:0. The ink ejection property (ejection stability) was evaluated as "B" when the content ratio (A:B) in the mixed solvent was 100:0.

As shown by the above-mentioned evaluation results of ejection stability, in the case where the boiling point (bp) of a solvent (2-methoxytoluene) selected as the second aromatic solvent B is 200° C. or lower, the drying of the ink in the nozzle proceeds by leaving the ink for 1 hour, and the ink ejection amount becomes unstable (is reduced). Further, also in the case where the first aromatic solvent A is used alone, the ink ejection amount becomes unstable (is reduced). On the other hand, in the case where the boiling point (bp) of a solvent selected as the second aromatic solvent B is 250° C. or higher, drying of the ink in the nozzle hardly proceeds even after the ink is left for 1 hour, and the ink ejection amount is stable.

<Evaluation of Film Flatness>

Figure 4:
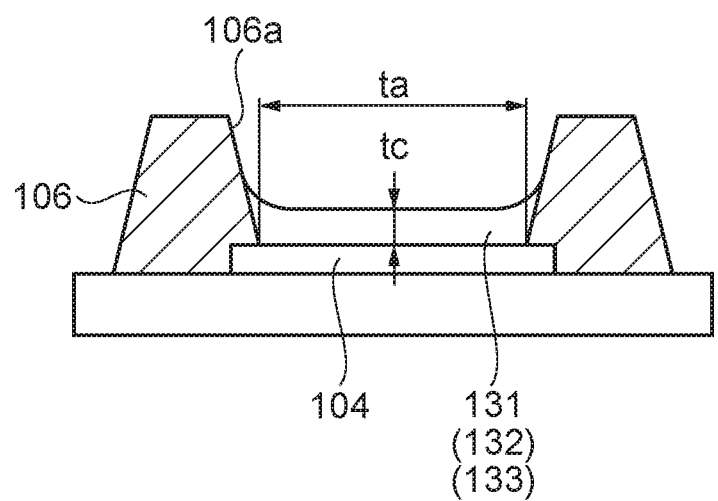
FIG. 4 is a schematic cross-sectional view showing the film thickness of a central portion of a pixel in a functional layer.

Next, an evaluation method for film flatness and evaluation results will be described with reference to FIG. and FIG. 9 to FIG. 16. FIG. 4 is a schematic cross-sectional view showing the film thickness of a central portion of a pixel in a functional layer, FIGS. 9(a) to 9(d) and FIGS. 10(e) to 10(g) are tables of evaluation results showing a relationship between a solvent configuration and film flatness in the case where a high-molecular weight hole injection transport material was used. FIGS. 11(a) to 11(d) and FIGS. 12(e) to 12(g) are tables of evaluation results showing a relationship between a solvent configuration and film flatness in the case where a high-molecular weight light emitting material was used. FIGS. 13(a) to 13(d) and FIGS. 14(e) to 14(g) are tables of evaluation results showing a relationship between a solvent configuration and film flatness in the case where a low-molecular weight hole injection transport material was used. FIGS. 15(a) to 15(d) and FIGS. 16(e) to 16(g) are tables of evaluation results showing a relationship between a solvent configuration and film flatness in the case where a low-molecular weight light emitting material was used.

In the inkjet method, as described above, by accurately ejecting a predetermined amount of the ink to the opening portion 106a surrounded by the partition wall 106, the film flatness of the formed functional layer is ensured. Further, it is considered that the film flatness is also affected by whether the solid component contained in the ink is a high-molecular weight material or a low-molecular weight material. Specifically, when the ink is applied to the opening portion 106a and dried, the pinning position (film fixed position) where the film formation starts on the side wall of the partition wall 106 varies depending on whether the solid component contained in the ink is a high-molecular weight material or a low-molecular weight material, and it is considered that this affects the film flatness after drying.

As shown in FIG. 4, the film thickness in a central portion of the pixel electrode 104 of the formed film is referred to as "intra-pixel central film thickness tc", and the average of the film thickness in a region in contact with the pixel electrode 104 is referred to as "intra-pixel average film thickness ta". These film thicknesses can be measured by, for example, a probe-type measurement device. The shape of the cross section of the film after film formation is swollen or dented in a central portion of the pixel according to the progress of drying of the ink applied to the opening portion 106a or the above-mentioned pinning position. That is, the intra-pixel central film thickness tc varies.

In an evaluation method for the film flatness of this embodiment, in the case where the intra-pixel average film thickness ta is 0.9 times or more the intra-pixel central film thickness tc and less than 1.2 times the intra-pixel central film thickness tc, the film flatness is evaluated as "A (good)". At this time, the film flatness when minute irregularities are observed on the film surface due to the deposition of the solid component is evaluated as "B (having deposits)". In the case where the intra-pixel average film thickness ta is 1.2 times or more the intra-pixel central film thickness tc and less than 1.3 times the intra-pixel central film thickness tc, the film flatness is evaluated as "C (somewhat poor)". In the case where the intra-pixel average film thickness ta is 1.3 times or more the intra-pixel central film thickness tc, the film flatness is evaluated as "D (poor)". Further, in the case where the intra-pixel average film thickness ta is 1.3 times or more the intra-pixel central film thickness tc, and apparent irregularities are observed on the film surface due to the deposition of the solid component, the film flatness is evaluated as "E (poor and having deposits)". In the case where the film surface has apparent irregularities, when the organic EL element 130 is lit on, a variation in current flowing through the functional layer 136 in the pixel occurs to cause uneven brightness, and thus irregularities are recognized. Incidentally, the conditions for drying and firing of the ink applied to the opening portion 106a are as shown in the above-mentioned method for producing the organic EL element 130.

In FIGS. 9(a) to 9(d) and FIGS. 10(e) to 10(g), as the high-molecular weight hole injection transport material (HIL, HTL), a material was selected from the above-mentioned PVK, PF, PPV, PMPS, PITA, poly[N,N'-bis(4-butylphenyl)-N,N'-bis(phenyl)-benzidine], and TFB. Further, as the first aromatic solvent A, a solvent was selected from the above-mentioned nitrobenzene, 2,3-dimethylnitrobenzene, and 2,4-dimethylnitrobenzene. Further, in addition to a combination with each of the above-mentioned α,α,4-trimethoxytoluene, diphenyl ether, 3-phenoxytoluene, benzylphenyl ether, aminobiphenyl, and diphenylamine as the second aromatic solvent B, a combination with 2-methoxytoluene having a boiling point (bp) of 170° C. was evaluated. 2-Methoxytoluene has a methoxy group (—OCH$_3$ group) which is an alkoxy group as the electron donating group.

In FIGS. 11(a) to 11(d) and FIGS. 12(e) to 12(g), as the high-molecular weight light emitting material (EML), each of poly[{9,9-dihexyl-2,7-bis(1-cyanovinylene)fluorenylene}-alt-co-{2,5-bis(N,N'-diphenylamino)-1,4-phenylene}] which is the above-mentioned red light emitting material (indicated by "Red-Poly-EM" in the tables for the sake of notation), poly[(9,9-dioctylfluorenyl-2,7-diyl)-alt-co-(1,4-benzo-{2,1',3}-thiadiazole)] (F8BT) which is the above-mentioned green light emitting material (indicated by "Green-Poly-EM" in the tables for the sake of notation), and poly[(9,9-dioctylfluorenyl-2,7-diyl)-co-(N,N'-diphenyl)-N,N'-di(pbutylphenyl)-1,4-diamino-benzene)] which is the above-mentioned blue light emitting material (indicated by "Blue-Poly-EM" in the tables for the sake of notation) was used and inks were formed. The first aromatic solvent A and the second aromatic solvent B were selected in the same manner as in the case of the high-molecular weight hole injection transport material (HIL, HTL).

The evaluation was performed by setting the content ratio (A:B) % of the first aromatic solvent A to the second aromatic solvent B in the mixed solvent to seven ratios: 0:100, 10:90, 30:70, 50:50, 70:30, 90:10, and 100:0. That is, the configuration of the ink is the same as in the case of the evaluation of the ejection stability described above.

As shown in FIG. 9(a) and FIG. 11(a), in the case where the solvent configuration was a combination of nitrobenzene with 2-methoxytoluene and the content ratio (A:B) in the mixed solvent was 0:100, the film flatness was evaluated as "E". In the case where the content ratio (A:B) in the mixed solvent was other than 0:100, the film flatness was evaluated as "D" in all the cases. In the case where the solvent configuration was a combination of 2,3-dimethylnitrobenzene or 2,4-dimethylnitrobenzene with 2-methoxytoluene and the content ratio (A:B) in the mixed solvent was 0:100, the film flatness was evaluated as "E". In the case where the content ratio (A:B) in the mixed solvent was 10:90, 30:70, 50:50, 70:30, 90:10, and 100:0, the film flatness was evaluated as "C".

On the other hand, as shown in FIGS. 9(b) to 9(d) and FIGS. 10(e) to 10(g), FIGS. 11(b) to 11(d) and FIGS. 12(e) to 12(g), in the case where nitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, when the content ratio (A:B) in the mixed solvent was 10:90, 30:70, 50:50, 70:30, and 90:10 except for 100:0 and 0:100, the film flatness was evaluated as "A" in all the cases. When the content ratio (A:B) in the mixed solvent was 0:100, the film flatness was evaluated as "B", and when the content ratio (A:B) in the mixed solvent was 100:0, the film flatness was evaluated as "D".

In the case where 2,3-dimethylnitrobenzene or 2,4-dimethylnitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, when the content ratio (A:B) in the mixed solvent was 10:90, 30:70, 50:50, 70:30, and 90:10 except for 100:0 and 0:100, the film flatness was evaluated as "A" in all the cases. When the content ratio (A:B) in the mixed solvent was 0:100, the film flatness was evaluated as "B", and when the content ratio (A:B) in the mixed solvent was 100:0, the film flatness was evaluated as "C".

In FIGS. 13(a) to 13(d) and FIGS. 14(e) to 14(g), as the low-molecular weight hole injection transport material (HIL, HTL), a material was selected from the above-mentioned VB-TCA, CuPc, TAPC, TPD, α-NPD, m-MTDATA, PDA-Si, 2-TNATA, TCTA, TDAPB, spiro-TAD, DPPD, DTP, HTM1, HTM2, TPT1, and TPTE. Further, as the first aromatic solvent A, a solvent was selected from the above-mentioned nitrobenzene, 2,3-dimethylnitrobenzene, and 2,4-dimethylnitrobenzene. Further, in addition to a combination with each of the above-mentioned α,α,4-trimethoxytoluene, diphenyl ether, 3-phenoxytoluene, benzylphenyl ether, aminobiphenyl, and diphenylamine as the second aromatic solvent B, a combination with 2-methoxytoluene having a boiling point (bp) of 170° C. was evaluated. 2-Methoxytoluene has a methoxy group (—OCH₃ group) which is an alkoxy group as the electron donating group.

In FIGS. 15(a) to 15(d) and FIGS. 16(e) to 16(g), as the low-molecular weight light emitting material (EML), a host material was selected from the above-mentioned CBP, BAlq, mCP, CDBP, DCB, PO6, SimCP, UGH3, and TDAPB, and a red dopant which is a red light emitting material (guest material) was selected from Bt2Ir(acac), Btp2Ir(acac), and PtOEP. Further, a green dopant which is a green light emitting material (guest material) was selected from Ir(ppy)3 and Ppy2Ir(acac). Further, a blue dopant which is a blue light emitting material (guest material) was selected from FIrpic, Ir(pmb)3, and FIrN4. The first aromatic solvent A and the second aromatic solvent B were selected in the same manner as in the case of the low-molecular weight hole injection transport material (HIL, HTL).

The evaluation was performed by setting the content ratio (A:B) % of the first aromatic solvent A to the second aromatic solvent B in the mixed solvent to seven ratios: 0:100, 10:90, 30:70, 50:50, 70:30, 90:10, and 100:0. That is, the configuration of the ink is the same as in the case of the evaluation of the high-molecular weight material described above.

As shown in FIG. 13(a) and FIG. 15(a), in the case where the solvent configuration was a combination of nitrobenzene with 2-methoxytoluene and the content ratio (A:B) in the mixed solvent was 0:100, the film flatness was evaluated as "E". In the case where the content ratio (A:B) in the mixed solvent was other than 0:100, the film flatness was evaluated as "E" in all the cases. In the case where the solvent configuration was a combination of 2,3-dimethylnitrobenzene or 2,4-dimethylnitrobenzene with 2-methoxytoluene and the content ratio (A:B) in the mixed solvent was 0:100, the film flatness was evaluated as "E". In the case where the content ratio (A:B) in the mixed solvent was 10:90, 30:70, 50:50, 70:30, 90:10, and 100:0, the film flatness was evaluated as "C".

On the other hand, as shown in FIGS. 13(b) to 13(d) and FIGS. 14(e) to 14(g), FIGS. 15(b) to 15(d) and FIGS. 16(e) to 16(g), in the case where nitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, when the content ratio (A:B) in the mixed solvent was 10:90, 30:70, 50:50, 70:30, and 90:10 except for 100:0 and 0:100, the film flatness was evaluated as "A" in all the cases. When the content ratio (A:B) in the mixed solvent was 0:100, the film flatness was evaluated as "B", and when the content ratio (A:B) in the mixed solvent was 100:0, the film flatness was evaluated as "D".

In the case where 2,3-dimethylnitrobenzene or 2,4-dimethylnitrobenzene as the first aromatic solvent A was combined with each of α,α,4-trimethoxytoluene, diphenyl ether, 3-phenoxytoluene, benzylphenyl ether, aminobiphenyl, and diphenylamine as the second aromatic solvent B, when the content ratio (A:B) in the mixed solvent was 10:90, 30:70, 50:50, 70:30, and 90:10 except for 100:0 and 0:100, the film flatness was evaluated as "A" in all the cases. When the content ratio (A:B) in the mixed solvent was 0:100, the film flatness was evaluated as "B", and when the content ratio (A:B) in the mixed solvent was 100:0, the film flatness was evaluated as "C". That is, even in the case where the solid component in the ink is a low-molecular weight material, the same evaluation of film flatness as in the case where the solid component in the ink is a high-molecular weight material was obtained.

As shown by the above-mentioned evaluation results of the film flatness, in the case where the boiling point (bp) of a solvent (2-methoxytoluene) selected as the second aromatic solvent B is 200° C. or lower, in the step of drying the ink, the second aromatic solvent B is evaporated prior to the first aromatic solvent A to increase the drying speed of the ink, and leveling at the time of film formation is not sufficiently performed, and therefore, the film flatness is deteriorated. On the other hand, in the case where the boiling point (bp) of a solvent selected as the second aromatic solvent B is 250° C. or higher, in the step of drying the ink, the second aromatic solvent B remains even after the first aromatic solvent A is evaporated, and therefore, the drying speed of the ink is decreased so that leveling at the time of film formation is sufficiently performed and the film flatness is improved. However, in the case where the first aromatic solvent A which shows a high dissolution property for the solid component is not contained in the ink (in the case where the content ratio (A:B) in the mixed solvent is 0:100), in the process of drying the second aromatic solvent B having a poor dissolution property for the ink, the solid component is likely to be deposited. Further, in the case where the second aromatic solvent B having a high boiling point is not contained in the ink (in the case where the content ratio (A:B) in the mixed solvent is 100:0), in the process of drying the first aromatic solvent A, drying proceeds relatively fast, and therefore, leveling at the time of film formation is not sufficiently performed, and the film flatness is deteriorated.

In light of the evaluation of the ejection stability and the film flatness described above, it is preferred that the boiling point of the first aromatic solvent A is 200° C. or higher and the second aromatic solvent B having a boiling point of 250° C. or higher is selected. Further, the content ratio (A:B) of the first aromatic solvent A to the second aromatic solvent B in the mixed solvent is preferably between 10:90 and 90:10.

Next, a relationship between the functional layer forming composition (ink) and the element characteristics of the organic EL element 130 will be described by showing Comparative Examples and Examples.

In this embodiment, as the element characteristics of the organic EL element 130, a driving voltage, a current efficiency, and a half lifetime were taken up. The driving voltage is a DC voltage value at which the luminous brightness of the organic EL element 130 becomes a predetermined value, and a smaller driving voltage is preferred. The current efficiency is a value (cd (candela)/A (ampere)) obtained by dividing the luminous brightness of the organic EL element 130 by the value of a current flowing when the luminous brightness of the organic EL element 130 is set to a predetermined value, and a higher current efficiency is preferred. The half lifetime is an energization time (h) until the luminous brightness of the organic EL element 130 is halved from a predetermined value, and a longer half lifetime is preferred. The predetermined value of the luminous brightness is, for example, 1000 cd (candela)/m² (square meter).

Comparative Example 1

The organic EL element of Comparative Example 1 is configured such that the hole injection layer 131, the hole transport layer 132, and the light emitting layer 133 in the functional layer 136 are formed by an inkjet method using an ink which does not contain the second aromatic solvent B. Specifically, nitrobenzene (bp: 210° C.) was used as the first aromatic solvent A, and the hole injection layer 131 having a film thickness of 10 nm to 30 nm was formed using an ink in which VB-TCA serving as a hole injection material was dissolved in nitrobenzene. Further, the hole transport layer 132 having a film thickness of 10 nm to 20 nm was formed using an ink in which TFB serving as a hole transport material was dissolved in nitrobenzene. Further, the light emitting layer 133 having a film thickness of 60 nm to 80 nm was formed using an ink in which F8BT (Green-Poly-EM) serving as a light emitting material from which fluorescence is obtained was dissolved in nitrobenzene. The configurations of the other electron transport layer 134 and electron injection layer 135 in the functional layer 136 are as described in the method for producing the organic EL element 130.

Comparative Example 2

In the organic EL element of Comparative Example 2, the hole injection layer 131, the hole transport layer 132, and the light emitting layer 133 were formed using an ink containing a mixed solvent obtained by adding 2-methoxytoluene (bp: 170° C.) as the second aromatic solvent B to nitrobenzene (bp: 210° C.) as the first aromatic solvent A in which solid component was dissolved. The layer constituent material and the film thickness of each layer are the same as those of Comparative Example 1. The content ratio (A:B) in the above mixed solvent is 50:50.

Comparative Example 3

In the organic EL element of Comparative Example 3, the hole injection layer 131, the hole transport layer 132, and the light emitting layer 133 were formed using an ink containing a mixed solvent obtained by adding 1,3,5-triethylbenzene (bp: 215° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 60:40.

Example 1

In the organic EL element of Example 1, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 10:90.

Example 2

In the organic EL element of Example 2, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 30:70.

Example 3

In the organic EL element of Example 3, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 50:50.

Example 4

In the organic EL element of Example 4, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 70:30.

Example 5

In the organic EL element of Example 5, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 1. The content ratio (A:B) in the above mixed solvent is 90:10.

In the above-mentioned Example 1 to Example 5, the content ratio (A:B) in the mixed solvent containing nitrobenzene (bp: 210° C.) as the first aromatic solvent A and 3-phenoxytoluene (bp: 272° C.) as the second aromatic solvent B was made different.

Example 6

In the organic EL element of Example 6, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 10:90.

Example 7

In the organic EL element of Example 7, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 30:70.

Example 8

In the organic EL element of Example 8, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 50:50.

Example 9

In the organic EL element of Example 9, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 70:30.

Example 10

In the organic EL element of Example 10, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 90:10.

In the above-mentioned Example 6 to Example 10, the content ratio (A:B) in the mixed solvent containing 2,3-dimethylnitrobenzene (bp: 245° C.) as the first aromatic solvent A and 3-phenoxytoluene (bp: 272° C.) as the second aromatic solvent B was made different.

Example 11

In the organic EL element of Example 11, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 10:90.

Example 12

In the organic EL element of Example 12, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 30:70.

Example 13

In the organic EL element of Example 13, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 50:50.

Example 14

In the organic EL element of Example 14, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 70:30.

Example 15

In the organic EL element of Example 15, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 1. The content ratio (A:B) in the above mixed solvent is 90:10.

In the above-mentioned Example 11 to Example 15, the content ratio (A:B) in the mixed solvent containing 2,4-dimethylnitrobenzene (bp: 245° C.) as the first aromatic solvent A and 3-phenoxytoluene (bp: 272° C.) as the second aromatic solvent B was made different.

In the configuration of the ink in each of Comparative Examples and Examples described below, TDAPB was used as a host material, and Ppy2Ir serving as a light emitting material (guest material) from which phosphorescence is obtained was used, and the other configuration was basically the same as the above-mentioned F8BT serving as a light emitting material from which fluorescence is obtained.

Comparative Example 4

In the organic EL element of Comparative Example 4, the hole injection layer 131 having a film thickness of 10 nm to 30 nm was formed using an ink in which the second aromatic solvent B was not contained, and nitrobenzene (bp: 210° C.) was used as the first aromatic solvent A, and VB-TCA serving as a hole injection material was dissolved in nitrobenzene. Further, the hole transport layer 132 having a film thickness of 10 nm to 20 nm was formed using an ink in which TFB serving as a hole transport material was dissolved in nitrobenzene. Further, the light emitting layer 133 having a film thickness of 60 nm to 80 nm was formed using an ink in which the above-mentioned light emitting material from which phosphorescence is obtained was dissolved in nitrobenzene. The configurations of the other electron transport layer 134 and electron injection layer 135 in the functional layer 136 are as described in the method for producing the organic EL element 130.

Comparative Example 5

In the organic EL element of Comparative Example 5, the hole injection layer 131, the hole transport layer 132, and the light emitting layer 133 were formed using an ink containing a mixed solvent obtained by adding 2-methoxytoluene (bp: 170° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 50:50.

Comparative Example 6

In the organic EL element of Comparative Example 6, the hole injection layer 131, the hole transport layer 132, and the light emitting layer 133 were formed using an ink containing a mixed solvent obtained by adding 1,3,5-triethylbenzene (bp: 215° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 60:40.

Example 16

In the organic EL element of Example 16, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 10:90.

Example 17

In the organic EL element of Example 17, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 30:70.

Example 18

In the organic EL element of Example 18, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 50:50.

Example 19

In the organic EL element of Example 19, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 70:30.

Example 20

In the organic EL element of Example 20, the hole injection layer 131, the hole transport layer 132, and the light emitting layer 133 were formed using an ink containing a mixed solvent obtained by adding 3-phenoxytoluene (bp: 272° C.) as the second aromatic solvent B to nitrobenzene (bp: 210° C.) as the first aromatic solvent A in which the solid component was dissolved. The layer constituent material and the film thickness of each layer are the same as those of Comparative Example 4. The content ratio (A:B) in the above mixed solvent is 90:10.

Example 21

In the organic EL element of Example 21, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 10:90.

Example 22

In the organic EL element of Example 22, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 30:70.

Example 23

In the organic EL element of Example 23, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 50:50.

Example 24

In the organic EL element of Example 24, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 70:30.

Example 25

In the organic EL element of Example 25, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,3-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 90:10.

Example 26

In the organic EL element of Example 26, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 10:90.

Example 27

In the organic EL element of Example 27, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 30:70.

Example 28

In the organic EL element of Example 28, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 50:50.

Example 29

In the organic EL element of Example 29, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 70:30.

Example 30

In the organic EL element of Example 30, the hole injection layer 131, the hole transport layer 132, and the light emitting layer 133 were formed using an ink containing a mixed solvent obtained by adding 3-phenoxytoluene (bp: 272° C.) as the second aromatic solvent B to 2,4-dimethylnitrobenzene (bp: 245° C.) as the first aromatic solvent A in which the solid component was dissolved. The layer constituent material and the film thickness of each layer are the same as those of Comparative Example 4. The content ratio (A:B) in the above mixed solvent is 90:10.

An evaluation method for the element characteristics of the organic EL element in this embodiment will be described. With respect to the driving voltage as the element characteristic, the driving voltage of Comparative Example 1 is taken as "1", and a case where the driving voltage of each of the other Comparative Examples 2 and 3, and Example 1 to Example 15 is smaller than 0.9 is evaluated as "S (superior)", 0.9 or more and less than 0.95 is evaluated as "A (good)", 0.95 or more and less than 1.05 is evaluated as "B (somewhat poor)", and 1.05 or more is evaluated as "C (poor)". Similarly, the driving voltage of Comparative Example 4 is taken as "1", and a case where the driving voltage of each of the other Comparative Examples 5 and 6, and Example 16 to Example 30 is smaller than 0.9 is evaluated as "S (superior)", 0.9 or more and less than 0.95 is evaluated as "A (good)", 0.95 or more and less than 1.05 is evaluated as "B (somewhat poor)", and 1.05 or more is evaluated as "C (poor)".

With respect to the current efficiency as the element characteristic, the current efficiency of Comparative Example 1 is taken as "1", and a case where the current efficiency of each of the other Comparative Examples 2 and 3, and Example 1 to Example 15 is larger than 1.1 is evaluated as "S (superior)", 1.05 or more and less than 1.1 is evaluated as "A (good)", 0.95 or more and less than 1.05 is evaluated as "B (somewhat poor)", and less than 0.95 is evaluated as "C (poor)". Similarly, the current efficiency of Comparative Example 4 is taken as "1", and a case where the current efficiency of each of the other Comparative Examples 5 and 6, and Example 16 to Example 30 is larger than 1.1 is evaluated as "S (superior)", 1.05 or more and less than 1.1 is evaluated as "A (good)", 0.95 or more and less than 1.05 is evaluated as "B (somewhat poor)", and less than 0.95 is evaluated as "C (poor)".

With respect to the half lifetime as the element characteristic, the half lifetime of Comparative Example 1 is taken as "1", and a case where the half lifetime of each of the other Comparative Examples 2 and 3, and Example 1 to Example 15 is larger than 1.5 is evaluated as "S (superior)", 1.0 or more and less than 1.5 is evaluated as "A (good)", 0.9 or more and less than 1.0 is evaluated as "B (somewhat poor)", and less than 0.9 is evaluated as "C (poor)". Similarly, the half lifetime of Comparative Example 4 is taken as "1", and a case where the half lifetime of each of the other Comparative Examples 5 and 6, and Example 16 to Example 30 is larger than 1.5 is evaluated as "S (superior)", 1.0 or more and less than 1.5 is evaluated as "A (good)", 0.9 or more and less than 1.0 is evaluated as "B (somewhat poor)", and less than 0.9 is evaluated as "C (poor)".

FIG. 17 is a table showing the evaluation results of the element characteristics of the organic EL elements of Comparative Example 1 to Comparative Example 3 and Example to Example 15, and FIG. 18 is a table showing the evaluation results of the element characteristics of the organic EL elements of Comparative Example 4 to Comparative Example 6 and Example 16 to Example 30.

As shown in FIG. 17, in the case where the light emitting material from which fluorescence is obtained was used, with respect to the element characteristics of the organic EL elements of Comparative Example 2 and Comparative Example 3, the driving voltage, current efficiency, and half lifetime were all evaluated as "B (somewhat poor)" as compared with those of Comparative Example 1. On the other hand, in Example 1 to Example 15, the element characteristics were evaluated as "S (superior)" or "A (good)". In particular, in Example 1 to Example 3, Example 6 to Example 8, and Example 11 to Example 13, in which the content ratio (A:B) of the first aromatic solvent A to the second aromatic solvent B in the mixed solvent was in the range of 10:90 to 50:50, the driving voltage, current efficiency, and half lifetime were all evaluated as "S (superior)". In Example 4, Example 9, and Example 14, in which the content ratio (A:B) in the mixed solvent was 70:30, the driving voltage and current efficiency were evaluated as "S (superior)", and the half lifetime was evaluated as "A (good)". Further, in Example 5, Example 10, and Example 15, in which the content ratio (A:B) in the mixed solvent was 90:10, the element characteristics were all evaluated as "A (good)".

As shown in FIG. 18, also in the case where the light emitting material from which phosphorescence is obtained was used, the same results as in the case where the light emitting material from which fluorescence is obtained was used were obtained. Specifically, with respect to the element characteristics of the organic EL elements of Comparative Example 5 and Comparative Example 6, the driving voltage, current efficiency, and half lifetime were all evaluated as "B (somewhat poor)" as compared with those of Comparative Example 4. On the other hand, in Example 16 to Example 18, Example 21 to Example 23, and Example 26 to Example 28, in which the content ratio (A:B) of the first aromatic solvent A to the second aromatic solvent B in the mixed solvent was in the range of 10:90 to 50:50, the driving voltage, current efficiency, and half lifetime were all evaluated as "S (superior)". In Example 19, Example 24, and Example 29, in which the content ratio (A:B) in the mixed solvent was 70:30, the driving voltage and current efficiency were evaluated as "S (superior)", and the half lifetime was evaluated as "A (good)". Further, in the case of Example 20, Example 25, and Example 30, in which the content ratio (A:B) in the mixed solvent was 90:10, the element characteristics were all evaluated as "A (good)".

From the evaluation results of the element characteristics in the above-mentioned Comparative Examples and the above-mentioned Examples, the element characteristics are improved as compared with those in Comparative Examples in any combination of the solvents as long as the content ratio (A:B) of the first aromatic solvent A to the second aromatic solvent B in the mixed solvent is in the range of 10:90 to 90:10. Further, in Examples in which the content ratio (A:B) in the mixed solvent was 10:90, 30:70, or 50:50, that is, in the case where the content ratio of the second aromatic solvent B is equal to or larger than the content ratio of the first aromatic solvent A, more favorable evaluation of the element characteristics was obtained. Based on such evaluation results, it is considered that due to an interaction (attractive force) between the first aromatic solvent A having an electron withdrawing property and the second aromatic solvent B having an electron donating property, the first aromatic solvent A having a low boiling point also evaporates simultaneously with the evaporation of the second aromatic solvent B having a high boiling point when a film is formed by drying and firing the ink. Therefore, the residual first aromatic solvent A having an electron withdrawing property in the film after film formation can be reduced. In other words, it is possible to provide a functional layer forming composition (ink) capable of obtaining desired excellent element characteristics by preventing the first aromatic solvent A having an electron withdrawing property from affecting the element characteristics by remaining in the film after film formation.

Incidentally, the reason why the element characteristics of Comparative Example 2 are inferior to those of Comparative Example 1 is considered that by including 2-methoxytoluene having a lower boiling point than nitrobenzene in the ink, the drying speed of the ink is increased, and therefore, the film flatness is decreased, and nitrobenzene remains in the film and affects the element characteristics. The reason why the element characteristics of Comparative Example 5 are inferior to those of Comparative Example 4 is the same as described above.

The reason why the element characteristics of Comparative Example 3 are inferior to those of Comparative Example 1 is that 1,3,5-triethylbenzene has a higher boiling point than nitrobenzene, but has a lower electron donating property than 3-phenoxytoluene used as the second aromatic solvent B in Examples, and therefore, it is considered that an interaction between nitrobenzene and 1,3,5-triethylbenzene is weak and nitrobenzene remains in the film after film formation and the element characteristics are deteriorated. The reason why the element characteristics of Comparative Example 6 are inferior to those of Comparative Example 4 is the same as described above.

In this embodiment, as a preferred example of the first aromatic solvent A having an electron withdrawing group, nitrobenzene, 2,3-dimethylnitrobenzene, and 2,4-dimethylnitrobenzene are exemplified, however, as the electron withdrawing group, other than a nitro group ($-NO_2$ group), a cyano group ($-NH_3$ group) can be exemplified. In consideration of an interaction between the organic EL material and the electron withdrawing group, the effect of the interaction is considered to be smaller in the case of a nitro group than in the case of a cyano group.

Further, as the electron withdrawing group, other than a nitro group, a halogen group (—F (a fluoro group), —Cl (a chloro group), —Br (a bromo group), or —I (an iodo group) can be exemplified. However, it is known that a halogen group has a stronger electron withdrawing property than a nitro group, and when a solvent having a halogen group remains in the functional layer, due to an interaction between the organic EL material and the halogen group, the element characteristics of the organic EL element are significantly deteriorated. In other words, it is considered that the first aromatic solvent A having a nitro group as the electron withdrawing group shows a relatively low reactivity with the organic EL material.

On the other hand, as shown in the above-mentioned Examples, in the content ratio (A:B) in the mixed solvent, even if the ratio of the second aromatic solvent B is increased, the element characteristics are not affected, and therefore, it is considered that the second aromatic solvent B having an alkoxy group or an amino group as the electron donating group shows little reactivity with the organic EL material.

That is, it is preferred to select both of the first aromatic solvent A and the second aromatic solvent B having a low reactivity with the organic EL element even if the solvents constituting the functional layer forming composition remain in the film after film formation. Further, in the above-mentioned Examples, one type of solvent was selected for each of the first aromatic solvent A and the second aromatic solvent B, however, the invention is not limited thereto, and a plurality of types of solvents may be selected for each solvent. Further, the mixed solvent is not limited to those constituted by the first aromatic solvent A and the second aromatic solvent B, and for example, in order to adjust the viscosity or surface tension of the ink, another aromatic solvent, a surfactant, or the like, having a low reactivity with the organic EL material may be contained.

It has been demonstrated that the functional layer forming composition (ink) of this embodiment is favorable as a composition to be used when at least one layer in the functional layer is formed using an inkjet method, but the functional layer forming composition can also be applied to, for example, a liquid phase process such as a constant amount ejection method, a spin coating method, or a spray coating method, other than the inkjet method.

Second Embodiment

<Electronic Apparatus>

Figure 19A:
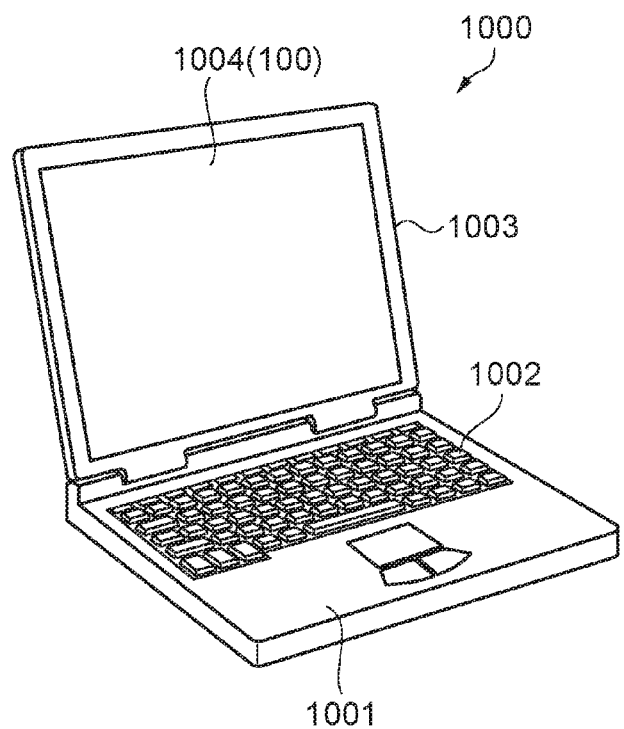
FIG. 19(a) is a schematic view showing a notebook-type personal computer which is one example of an electronic apparatus.
Figure 19B:
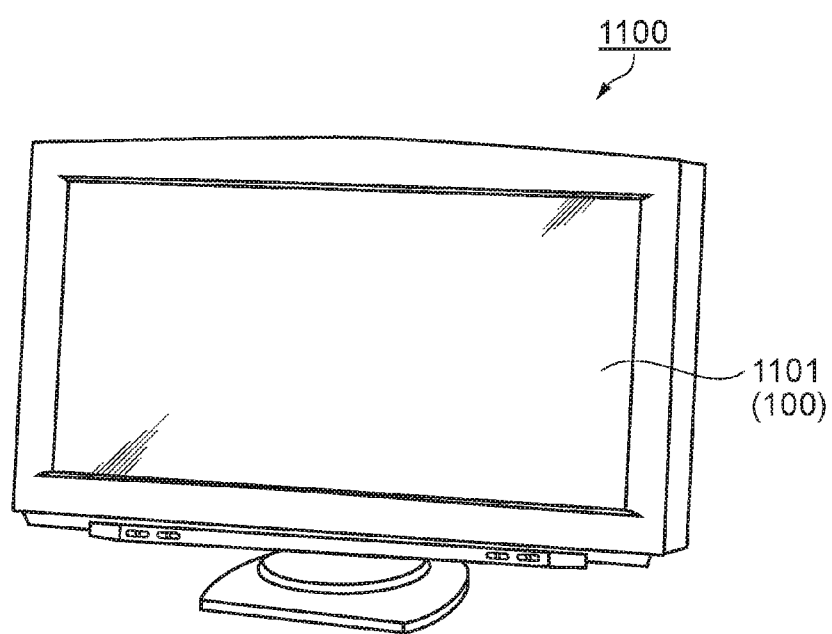
FIG. 19(b) is a schematic view showing a thin-screen television (TV) which is one example of an electronic apparatus.

Next, the electronic apparatus of this embodiment will be described with reference to FIG. 19. FIG. 19(*a*) is a schematic view showing a notebook-type personal computer which is one example of the electronic apparatus, and FIG. 19(*b*) is a schematic view showing a thin-screen television (TV) which is one example of the electronic apparatus.

As shown in FIG. 19(*a*), a personal computer 1000 as the electronic apparatus is constituted by a main body part 1001 provided with a keyboard 1002 and a display unit 1003 provided with a display part 1004, and the display unit 1003 is supported rotatably with respect to the main body part 1001 through a hinge structure part.

In this personal computer 1000, the organic EL device 100 of the above-mentioned first embodiment is mounted on the display part 1004.

As shown in FIG. 19(*b*), in a thin-screen television (TV) 1100 as the electronic apparatus, the organic EL device 100 of the above-mentioned first embodiment is mounted on a display part 1101.

In the organic EL element 130 provided in each of the sub-pixels 110R, 110G, and 110B of the organic EL device 100, at least one layer of the hole injection layer 131, the hole transport layer 132, and the light emitting layer 133 in the functional layer 136 is formed by a liquid phase process (inkjet method) using the functional layer forming composition of the above-mentioned first embodiment. Therefore, the film flatness in the functional layer 136 is ensured, and the organic EL device 100 including the organic EL element 130 having excellent element characteristics is produced. That is, the personal computer 1000 or the thin-screen TV 1100 having excellent display quality and reliable quality can be provided.

The electronic apparatus in which the organic EL device 100 is mounted is not limited to the above-mentioned personal computer 1000 and thin-screen TV 1100. For example, electronic apparatuses having a display part such as a portable information terminal such as a smartphone or a POS, a navigator, a viewer, a digital camera, and a monitor direct view-type video tape recorder can be exemplified.

Incidentally, the organic EL device 100 is not limited to those constituting a display part, and may be a lighting device or a light exposure device which exposes a photosensitive material to light.

The invention is not limited to the above-mentioned embodiments, and appropriate modifications are possible without departing from the gist or idea of the invention readable from the claims and the entire specification. A functional layer forming composition thus modified and a method for producing the functional layer forming composition, and a method for producing an organic EL element, an organic EL device, and an electronic apparatus to which an organic EL device is applied are also included in the technical scope of the invention. Other than the above-mentioned embodiments, various modification examples can be contemplated. Hereinafter, modification examples will be described.

Modification Example 1

It is only necessary that the organic EL device 100 include the organic EL element 130 having the functional layer 136 formed using the functional layer forming composition of the invention in any of the sub-pixels 110R, 110G, and 110B. For example, in the sub-pixel 110R and the sub-pixel 110G, the organic EL element 130 having the functional layer 136 formed using the functional layer forming composition is included, and in the subpixel 110B, the organic EL element 130 having the functional layer 136 formed by a gas phase process may be included.

Modification Example 2

The functional layer forming composition of the invention is not limited to being used in the formation of the functional layer 136 including the light emitting layer. For example, a solid component (organic material) which is a solute may be a circuit element forming material of a semiconductor layer or the like constituting an organic transistor.

REFERENCE SINGS LIST

50: hole injection layer forming ink as functional layer forming composition, 60: hole transport layer forming ink as functional layer forming composition, 70: light emitting layer forming ink as functional layer forming composition, 100: organic EL device, 104: pixel electrode, 105: counter electrode, 106a: opening portion as film forming region, 130: organic EL element, 133: light emitting layer, 136: functional layer, 1000: personal computer as electronic apparatus, 1100: thin-screen television (TV)

The entire disclosure of Japanese Patent Application No. 2015-062200, filed Mar. 25, 2015 is expressly incorporated by reference herein.

The invention claimed is:

1. A functional layer forming composition, which is a functional layer forming composition to be used when at least one layer in a functional layer containing an organic material is formed by a liquid phase process, wherein
the composition comprises:
a solid component for forming a functional layer; and
a first aromatic solvent having an electron withdrawing group and a second aromatic solvent having an electron donating group,
the boiling point of the second aromatic solvent is higher than the boiling point of the first aromatic solvent, and
the electron withdrawing group is a nitro group.

2. The functional layer forming composition according to claim 1, wherein
the boiling point of the first aromatic solvent is 200° C. or higher, and
the boiling point of the second aromatic solvent is 250° C. or higher.

3. The functional layer forming composition according to claim 1, wherein the electron donating group is an alkoxy group or an amino group.

4. The functional layer forming composition according to claim 1, wherein the content ratio of the second aromatic solvent is 10% or more and 90% or less.

5. The functional layer forming composition according to claim 4, wherein the content ratio of the second aromatic solvent is equal to or more than the content ratio of the first aromatic solvent.

6. The functional layer forming composition according to claim 1, wherein the first aromatic solvent is at least one type selected from nitrobenzene, 2,3-dimethylnitrobenzene, and 2,4-dimethylnitrobenzene.

7. The functional layer forming composition according to claim 1, wherein the second aromatic solvent is at least one type selected from trimethoxytoluene, diphenyl ether, 3-phenoxytoluene, benzylphenyl ether, aminobiphenyl, and diphenylamine.

8. A method for producing an organic EL element, which is a method for producing an organic EL element in which a functional layer including a light emitting layer is sandwiched between a pair of electrodes, comprising:
a step of applying the functional layer forming composition according to claim 1, onto one electrode of the pair of electrodes; and a step of forming at least one layer in the functional layer by drying and solidifying the applied functional layer forming composition.

9. The method for producing an organic EL element according to claim 8, wherein in the step of applying the functional layer forming composition, the functional layer forming composition is applied to a film forming region on the one electrode by an inkjet method.

10. An organic EL device, comprising an organic EL element produced using the method for producing an organic EL element according to claim 8.

11. An electronic apparatus, comprising the organic EL device according to claim 10.

12. A method for producing a functional layer forming composition, which is a method for producing a functional layer forming composition to be used when at least one layer in a functional layer containing an organic material is formed by a liquid phase process, wherein
the method comprises:
a step of dissolving a solid component for forming a functional layer in a first aromatic solvent having an electron withdrawing group; and
a step of adding a second aromatic solvent having an electron donating group to the first aromatic solvent in which the solid component for forming the functional layer is dissolved, and
the boiling point of the second aromatic solvent is higher than the boiling point of the first aromatic solvent, and
the electron withdrawing group is a nitro group.

* * * * *